US007844930B2

(12) United States Patent
Pandey et al.

(10) Patent No.: US 7,844,930 B2
(45) Date of Patent: Nov. 30, 2010

(54) METHOD AND APPARATUS FOR CIRCUIT PARTITIONING AND TRACE ASSIGNMENT IN CIRCUIT DESIGN

(75) Inventors: Awartika Pandey, Sunnyvale, CA (US); Drazen Borkovic, Mountain View, CA (US); Kenneth S. McElvain, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 691 days.

(21) Appl. No.: 11/762,024

(22) Filed: Jun. 12, 2007

(65) Prior Publication Data

US 2007/0234257 A1 Oct. 4, 2007

Related U.S. Application Data

(62) Division of application No. 10/792,933, filed on Mar. 3, 2004, now Pat. No. 7,237,214.

(60) Provisional application No. 60/452,314, filed on Mar. 4, 2003.

(51) Int. Cl.
*G06F 17/50* (2006.01)
(52) U.S. Cl. .................................. 716/5; 716/7; 716/12
(58) Field of Classification Search ...................... 716/5, 716/7, 12
See application file for complete search history.

(56) References Cited

U.S. PATENT DOCUMENTS 5,113,352 A 5/1992 Finnerty

| 5,218,551 | A  | 6/1993  | Agrawal et al. |
| 6,480,991 | B1 | 11/2002 | Cho et al. |
| 6,907,592 | B1 | 6/2005  | Dante |
| 6,996,512 | B2 | 2/2006  | Alpert et al. |
| 7,107,563 | B1 | 9/2006  | Kong |

OTHER PUBLICATIONS

C. Fiduccia and R. Mattheyses, "A linear-time heuristic for improving network partitions", In Proceedings of the Design Automation Conference, 1982.
Scott Hauck and Gaetano Borriello, "Logic Partition Orderings for Multi-FPGA Systems", ACM/SIGDA International Symposium on Field-Programmable Gate Arrays, pp. 32-38, Feb. 1995.
Scott Hauck and Gaetano Borriello, "An Evaluation of Bipartitioning Techniques", IEEE Trans. On CAD, vol. 16, No. 8, pp. 849-866, Aug. 1997.
Thomas H. Cormen, et al., "Introduction to Algorithms", the MIT Press, Nineteenth printing, Chapter 27, pp. 579-629, 1997.

*Primary Examiner*—Phallaka Kik
(74) *Attorney, Agent, or Firm*—Blakely, Sokoloff, Taylor & Zafman, LLP; Judith A. Szepesi

(57) ABSTRACT

Methods and apparatuses to design a circuit. In one embodiment, the method includes determining a first multiplexing ratio by a computer. The method, in one embodiment, further includes determining, according to the first multiplexing ratio, a first partition solution of the circuit and a first trace assignment solution for nets crossing partition boundaries of the first partition solution of the circuit. In one embodiment, the first trace assignment solution time multiplexes signals for a first plurality of nets crossing partition boundaries of the first partition solution according to the first multiplexing ratio, the first trace assignment solution satisfying a trace constraint, the first partition solution satisfying an area constraint when circuitry for time multiplexing signals for the first plurality of nets is considered.

20 Claims, 39 Drawing Sheets

|  | Number of Blocks in Partition A | Number of Blocks in Partition B | Number of Blocks in Partition C | Number of Blocks in Partition D |
|---|---|---|---|---|
| Net mpr | 1 | 1 | 1 | 0 |
| Net nr | 1 | 0 | 1 | 0 |
| Net pq | 0 | 2 | 0 | 0 |
| ⋮ | | | | |

Fig. 35

METHOD AND APPARATUS FOR CIRCUIT PARTITIONING AND TRACE ASSIGNMENT IN CIRCUIT DESIGN

This application is a divisional of U.S. application Ser. No. 10/792,933, now U.S. Pat. No. 7,237,214 filed on Mar. 3, 2004. The present application also claims the benefit of the filing date of Provisional Application No. 60/452,314, filed on Mar. 4, 2003, and entitled "Method and Apparatus for Circuit Partitioning and Trace Assignment In Circuit Design" by the inventors Awartika Pandey, Drazen Borkovic and Kenneth S. McElvain, which is hereby incorporated herein by reference.

FIELD OF THE INVENTION

The invention relates to circuit design, and more particularly to circuit partitioning and trace assignment.

BACKGROUND

For the design of circuits (e.g., digital or analog circuits) on the scale of VLSI (very large scale integration) technology, designers often employ computer aided techniques. Schematics and/or description languages have been used to describe the design of circuits (digital or analog). Standard languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technology/architecture to implement logic circuits within their integrated circuits. Thus, the technology independent RTL netlist is mapped to create a netlist which is specific to a particular vendor's technology/architecture.

One operation, which is often desirable in this process, is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

Logic partitioning is typically performed in the design of a digital circuit. Partitioning circuits enable one to apply divide-and-conquer techniques to simplify the design process (e.g., placement and routing). For example, a large digital circuit can be partitioned into portions so that each portion is implemented in an FPGA chip; and, the FPGA chips are interconnected by wire traces on a circuit board. Further, a digital circuit on a chip can be partitioned into regions on the chip, interconnected with chip wiring.

Partitioning algorithms have been developed to minimize the communication between partitions while ensuring that each portion is no larger than allowed (e.g., constrained by the capacity of an FPGA chip, or the area of a region on a chip). For example, U.S. Pat. No. 5,854,752 describes a method for partitioning a logic circuit for emulation under a virtual wires method using programmable logic devices. Many existing partitioning algorithms based on bipartitioning techniques, which find two partitions of a network of cells connected by nets such that the number of nets that connect the cells in both partitions is minimal. For example, the Fiduccia-Mattheyses algorithm (described in C. M. Fiduccia and R. M. Mattheyses, "A Linear-Time Heuristic for improving Network Partitions", Proceedings of the 19th Design Automation Conference, pp. 175-181, June 1982) is one of such bipartitioning techniques. A bipartitioning algorithm may be used repeatedly to partition a circuit into more than two partitions. Some multi-way partitioning techniques can also be found in the literature (e.g., Pak K. Chan, Martine D. F. Schlag, Jason Y. Zien, "Spectral-Based Multi-Way FPGA Partitioning", Proceedings of the third international ACM symposium on Field-programmable gate arrays, p. 133-139, Feb. 12-14, 1995; George Karypis and Vipin Kumar, "Multilevel k-way Hypergraph Partitioning", Proceedings of the $36^{th}$ ACM/IEEE conference on Design automation conference, p. 343-348, Jun. 21-25, 1999).

SUMMARY OF THE DESCRIPTION

Methods and apparatuses for circuit partitioning and incremental trace assignment are described here. Some embodiments of the present invention are summarized in this section.

In one embodiment of the present invention, a cost function based on both the partitioning solution and the trace assignment solution is used for the partitioning of a circuit; in reducing the cost function, blocks of circuits are moved among partitions and the trace assignment are updated accordingly to evaluate the cost function. In one embodiment, the traces and nets are grouped according to the partitions they connect for trace assignment. In one embodiment, a flow diagram is constructed for assigning nets to traces; and, maximum flow algorithms are used. In one embodiment, a flow diagram includes feedthrough solutions, in which flow is not conserved at certain nodes. In one embodiment, linear programming techniques (e.g., integer linear programming techniques) are used for assigning nets to traces. In one embodiment, a distribution of nets, which defines the numbers of blocks that each net has in each partition, is computed and maintained for efficient determination of the number of nets in net groups.

In one embodiment of the present invention, a method for designing at least one integrated circuit (IC) includes: partitioning a circuit into portions which represent a partitioning solution; assigning traces to interconnect the portions to generate a trace assignment solution; and optimizing the circuit through a modification of at least one of the partitioning solution and the trace assignment solution, the optimizing based on evaluating a design parameter which is based at least in part on the trace assignment solution. In one example, the optimizing is through a modification to both the partitioning solution and the trace assignment solution; and, the design parameter is further based on the partitioning solution. In one example, the design parameter is a cost function; the cost function increases as the number of nets that cannot be assigned to traces in the trace assignment solution increases; and, the cost function increases as an area of circuits in a partition in the partitioning solution that excesses a threshold increases. In one example, the optimizing includes: first evaluating the design parameter; modifying the partitioning solution after evaluating the design parameter; modifying the trace assignment solution after modifying the partitioning solution; second evaluating the design parameter after modifying the trace assignment solution; and determining if the design parameter is improved through modifying the partitioning solution and modifying the trace assignment solution. In one example, the optimizing further includes: determining gains in the design parameter for a plurality of modification candidates for the partitioning solution; selecting first one from the modification candidates based on the gains; and performing the first one selected from the modification candidates.

In one embodiment of the present invention, a method for circuit design includes: determining a distribution of nets of a circuit, the distribution of the nets comprising numbers of blocks that each net has in each of a plurality of partitions of the circuit in a partitioning solution; moving a first block of the circuit from a source partition to a destination partition to modify the partitioning solution; updating the distribution of the nets after the move. In one example, updating the distribution of the nets includes: updating numbers of blocks that each net connecting the first block has in the source and destination partitions. In one example, updating the distribution of the nets includes: determining a first net that connects the first block; decreasing the number of blocks that the first net has in the source partition by one; and increasing the number of blocks that the first net has in the destination partition by one. In one example, nets are grouped according to the partitions they connect; each net group contains nets that connect a same set of partitions; after a first net that is moved from a source net group to a destination net group is determined, number of nets in the source net group is decreased by one; and, the number of nets in the destination net group is increased by one. In one example, when the number of blocks that the first net has in a partition changes between 1 and 0, the first net is determined to be moved from the source net group to the destination group (e.g., when a change from 1 to 0 in a number of blocks that the first net has in the source partition is detected, or when a change from 0 to 1 in a number of blocks that the first net has in the destination partition is detected).

In one embodiment of the present invention, a method for circuit partitioning comprising: evaluating a design goal indicator, which is a function of a partitioning solution for a circuit and a function of a trace assignment solution for the circuit; and improving the design goal indicator through modifying the first partitioning solution and through modifying the first trace assignment solution. In a partitioning solution, the circuit is partitioned into a plurality of partitions; and, the plurality of partitions containing a plurality of first portions of the circuit respectively in the first partitioning solution. In the first partitioning solution, first nets of the circuit interconnects the plurality of the first portions. At least a portion of the first nets is assigned to traces in the first trace assignment solution. Traces are wiring resources available for interconnecting portions of the circuits in the plurality of partitions. The design goal indicator is first evaluated based on a first partitioning solution for the circuit and a first trace assignment solution for the circuit. The first partitioning solution is modified to generate a second partitioning solution; and, the first trace assignment solution is modified to generate a second trace assignment solution. In the second partitioning solution, the plurality of partitions containing a plurality of second portions of the circuit respectively in the second partitioning solution; and, second nets of the circuit interconnects the plurality of the second portions. In the second trace assignment solution, at least a portion of the second nets is assigned to traces in the second trace assignment solution. In one example, the design goal indicator is a function of unassigned nets in a trace assignment solution in which the unassigned nets lack corresponding traces for connectivity. In one example, the design goal indicator is a function of a number of unassigned nets in a group of nets which interconnect portions in a group of partitions in the plurality of partitions; and, the design goal indicator is further a function of a number of traces in a group of traces which provide wiring resources for a group of partitions in the plurality of partitions. In one example, the design goal indicator is further a function of the area used by a portion of the circuit in one of the plurality of partitions in a partitioning solution and a function of the area available for the one of the plurality of partitions. In one example, improving the design goal indicator includes: performing a first modification to the first partitioning solution to generate a third partitioning solution; determining a third trace assignment solution according to the third partitioning solution; and comparing the design goal indicator based on the third partitioning solution and the third trace assignment solution with the design goal indicator based on the first partitioning solution and the first trace assignment solution to select the second partitioning solution from the first and third trace assignment solutions and to select the second trace assignment solution from the first and third trace assignment solutions. In one example, the first modification includes: moving a first block of the circuit from a first one of the plurality of partitions to a second one of the plurality of partitions. In one example, improving the design goal indicator further includes: determining to move the first block from the first one of the plurality of partitions to the second one of the plurality of partitions from a list of modifications according to a gain in the design goal indicator due to each of the list of the modifications. In one example, the first modification further includes: moving a second block of the circuit from a third one of the plurality of partitions to a fourth one of the plurality of partitions after moving the first block. In one example, improving the design goal indicator further includes: determining to move the second block from the third one of the plurality of partitions to the fourth one of the plurality of partitions after said moving the first block.

In one embodiment of the present invention, a method for trace assignment includes: grouping nets into net groups, grouping traces into trace groups, assigning at least a portion of the nets to the traces through maximizing a sum of assignment of nets in each of the net groups to traces in corresponding at least one of the trace groups. In a partitioning solution for a circuit, the nets interconnect portions of the circuit; the portions are contained within a plurality of partitions of the circuit respectively; and, each net of a net group interconnects portions of the circuit that are contained respectively within a same group of partitions of the plurality of partitions. The traces provides wiring resources for interconnecting portions of the circuit contained respectively within the plurality of partitions of the circuit; and, each trace of a trace group provides wiring resources for the same group of partitions of the plurality of partitions. In one embodiment, assigning the nets to traces includes: determining maximum flow in a graph, the graph including net nodes, trace nodes and matching edges, each net node representing a corresponding one of the net groups, flow from each net node representing a number of nets to be assigned from the corresponding one of the net groups, each trace node representing a corresponding one of the trace groups, flow into each trace node indicating a number of traces in the corresponding one of the trace groups that are assigned to corresponding nets, each matching edge connecting one of the net nodes to one of the trace nodes to conduct flow from the one of the net nodes to the one of the trace nodes, the maximum flow corresponding to a sum of flow in the matching edges. In one example, a first portion of nets in a first one of the net groups are assigned to traces in a first one of the trace groups; and, a second portion of the nets in the first one of the net groups are assigned to traces in a second one of the trace groups. In another embodiment, assigning the nets to traces includes: determining maximum flow in a graph, the graph including net nodes, tree nodes, trace nodes and matching edges, each net node representing a corresponding one of the net groups, flow from each net node representing a number of nets to be assigned from the corresponding one of the net groups, each trace node representing a corresponding one of the trace groups, flow into each trace node indicating a number of traces in the corresponding one of the trace groups that are assigned to corresponding nets, each tree node representing a group of trace groups and connecting to a corresponding group of trace nodes through corresponding ones of the tree edges, each tree edge conducting flow from one of the tree nodes to one of the trace nodes, an amount of flow into each tree node causing the amount of flow to each of the corresponding group of trace nodes, each matching edge connecting one of the net nodes to one of the tree nodes and the trace nodes to conduct flow from the one of the net nodes to one of the tree nodes and the trace nodes, the maximum flow corresponding to a sum of flow in the matching edges. In one example, a first portion of nets in a first one of the net groups are assigned to traces in a first one of the trace groups and traces in a second one of the trace groups.

In one embodiment of the present invention, a method for trace assignment includes: grouping traces into trace groups, the traces providing wiring resources for interconnecting portions of a circuit in partitions of the circuit, the traces being grouped into the trace groups according to partitions connected by each of the traces; grouping first nets into first net groups, the first nets interconnecting first portions of a circuit, the first portions being in the partitions respectively according to a first partitioning solution, the first nets being grouped into the first net groups according to partitions within which portions connected by each of the first nets are contained; determining maximum assignment of the first nets to the traces through maximizing a flow in a first graph from first net nodes, the first net nodes representing the first net groups, the flow in the first graph flowing into trace nodes, the trace nodes representing the trace groups, flow from a net node to a trace node representing assignment of net to trace from the net node to the trace node; grouping second nets into second net groups, the second nets interconnecting second portions of a circuit, the second portions being in the partitions respectively according to a second partitioning solution, the second nets being grouped into the second net groups according to portions connected by each of the second nets; and determining maximum assignment of the second nets to the traces through modifying the first graph to generate a second graph, in which second net nodes representing the second net groups, and through maximizing a flow in the second graph from the second net nodes. In one example, the traces comprise at least one of: a) wire traces for interconnecting portions of the circuit in a plurality of regions of a printed circuit board; and b) routing resources for interconnecting portions of the circuit in a plurality of regions of a chip. In one example, each of the first and second graphs comprises a source node connected to each net node through a net edge, each net edge allowing flow from the source node to a net node, each net node having total out flow that is equal to total in flow. In one example, each of the first and second graphs comprises a target node connected to each trace node through a trace edge, each trace edge allowing flow from a trace node to the target node, each trace node having total out flow that is equal to total in flow. In one example, each of the first and second graphs comprises matching edges, each matching edge connecting a net node and a matching trace node, flow in each matching edge representing assignment of net to trace. In one example, each of the first and second graphs comprises tree nodes and matching edges, each tree node connected to a plurality of trace nodes through tree edges to represent a combination of traces in the plurality of trace nodes for providing a connection, each matching edges connecting a net node to one of: a tree node and a trace node, flow in each matching edge representing assignment of net to trace, flow in a matching edge into each tree node causing equal amount of out flow to the plurality of trace nodes through the trace nodes. In one example, modifying the first graph to generate the second graph includes: modifying flow capacity for a portion of the first graph according to the second net groups to generate the second graph. In another example, modifying the first graph to generate the second graph further comprises: modifying capacity for flow for a portion of the first graph to generate the second graph.

In one embodiment of the present invention, a method to design a circuit includes: determining a first multiplexing ratio; and determining a first partition solution of the circuit and a first trace assignment solution for nets crossing partition boundaries of the first partition solution of the circuit according to the first multiplexing ratio. The first trace assignment solution time multiplexes signals for a first plurality nets crossing partition boundaries of the first partition solution according to the first multiplexing ratio so that the first trace assignment solution satisfies a trace constraint. The first partition solution satisfies an area constraint when circuitry for time multiplexing signals for the first plurality nets is considered. In one embodiment, the multiplexing ratio is incrementally adjusted (e.g., reduced by one at a time) to tighten the trace requirement. In one example, after the first multiplexing ratio is adjusted to determine a second multiplexing ratio, a second partition solution of the circuit and a second trace assignment solution for nets crossing partition boundaries of the second partition solution of the circuit are determined according to the second multiplexing ratio. The second trace assignment solution time multiplexes signals for a second plurality nets crossing partition boundaries of the second partition solution according to the second multiplexing ratio so that the second trace assignment solution satisfies a trace constraint. The second partition solution satisfies an area constraint when circuitry for time multiplexing signals for the second plurality nets is considered. In one example, determining the first partition solution of the circuit and the first trace assignment solution includes: selectively moving a block of the circuit from a first partition to a second partition to improve a design goal which is a function of both a partition solution and a trace assignment solution. In one example, resources available for nets crossing partition boundaries are determined according to the first multiplexing ratio; and, the trace constraint is based on the trace resource determined according to the first multiplexing ratio. In one example, determining the trace resources includes: reserving a number of traces between a first partition and a second partition for a number of signals that cannot be time multiplexed; and multiplying remaining number of traces between the first partition and the second partition, which are not reserved, by the first multiplexing ratio to determined the trace resources.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIG. 35 shows an example of a distribution of net maintained for updating capacities of net groups according to one embodiment of the present invention.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to an or one embodiment in the present disclosure are not necessary to the same embodiment; and, such references means at least one.

Many of the methods of the present invention may be performed with a digital processing system, such as a conventional, general purpose computer system. Special purpose computers which are designed or programmed to perform only one function may also be used.

Figure 1:
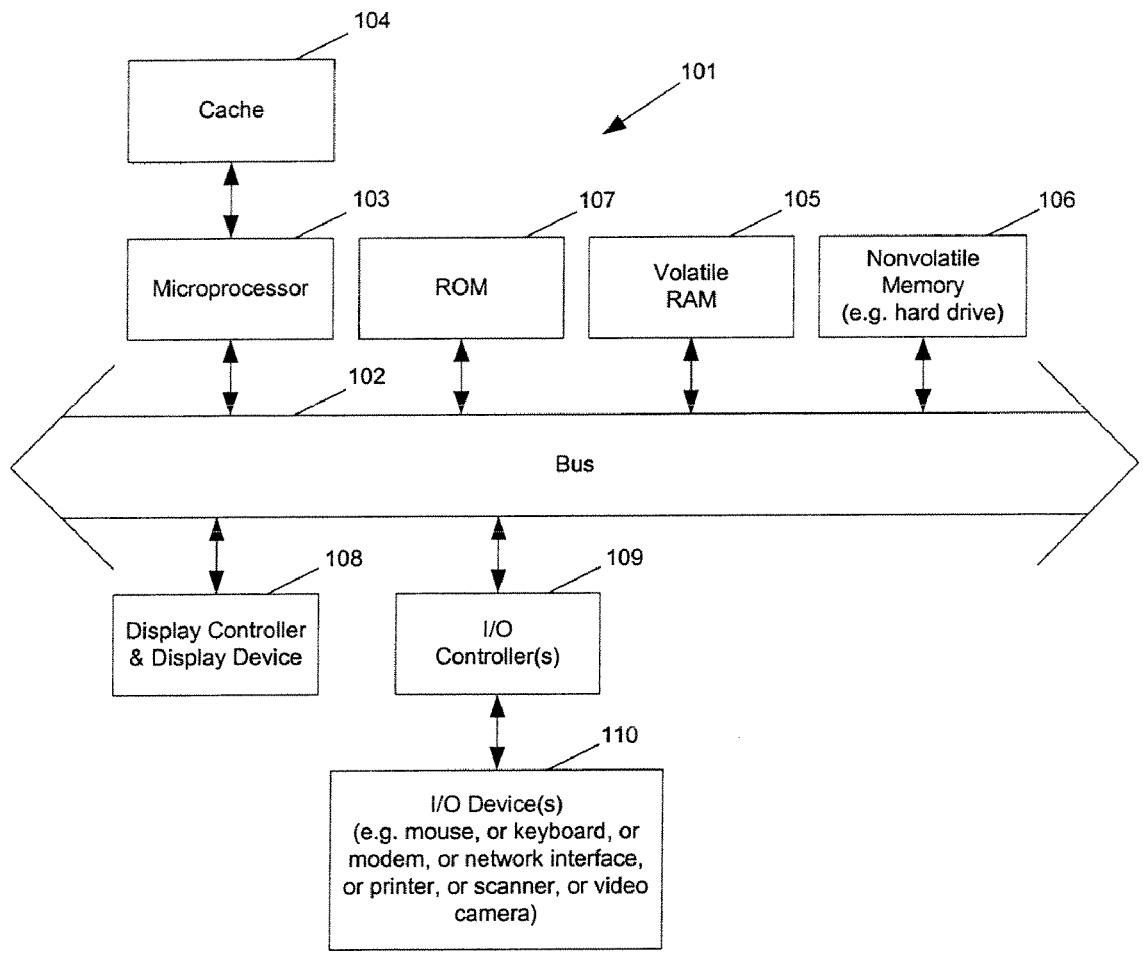
FIG. 1 shows a block diagram example of a data processing system which may be used with the present invention.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/ or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/ non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

Conventional partitioning techniques do not take the trace connectivity between containers into account. Thus, a partition solution of a conventional partitioning technique may require more wire traces than what are available on a circuit board to interconnect the partitions of the circuit. To meet the constraint on wire traces, Time Domain Multiplexing (TDM) may be used to send multiple signals for different nets across a time shared wire. However, TDM introduces additional delay in the circuit; and, TDM can be very complex when there are multiple clock domains in the circuit.

At least one embodiment of the present invention partitions a circuit (e.g., a gate level logic circuit, a register transfer level circuit, a behavioral level circuit, or others) into multiple partition containers connected by traces according to the trace connectivity available between the containers. A partition container hosts a portion of the circuit. For example, a partition container can be a chip on a printed circuit board where the chips are interconnected by wire traces on the board; a partition container can also be a physical region on a chip where the regions on the chip are interconnected with chip wiring. A partition container has multiple connection points or pins through which the portion of the circuit hosted inside the partition container can be connected to other portions of the circuit outside the partition container. A trace (e.g., a wire trace on a printed circuit board, or chip wiring, or routing resource on a chip, or others) provides wiring resources (e.g., wire connections) to interconnect portions of a circuit hosted in two or more containers.

In one embodiment of the present invention, a circuit is split into multiple portions such that: 1) each of the multiple portions can fit into one container; and, 2) there are a sufficient number of traces among the containers to ensure the required net connectivity. Conventional partitioning methods take into account the area and the number of pins of the container without considering the trace connections among the containers. Such conventional methods may lead to infeasible solutions due to that the constraints on the available trace connections between the containers are not considered during the partitioning process. For example, consider a container that has 100 pins, 50 of which are used by the 50 traces that connect to another container. The remaining 50 pins are used for connections to other containers. A conventional method may generate a partition solution that requires only 60 nets to be assigned to the 50 traces between the two containers. Such a solution is not feasible (without TDM), even though the constraints on the pin numbers are met (only 60 of 100 pins are used).

Figure 2:
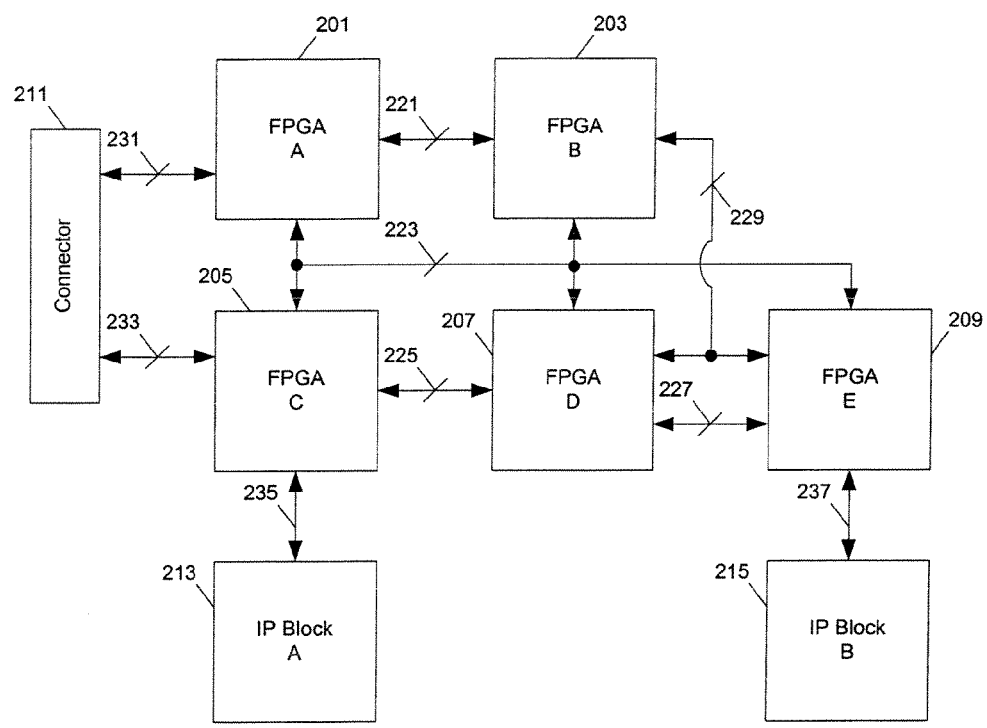
FIG. 2 shows a multi-FPGA board with chips interconnected by wire traces which can be designed according to embodiments of the present invention.

FIG. 2 shows a multi-FPGA board with chips interconnected by wire traces which can be designed according to embodiments of the present invention. On a multi-FPGA circuit board, multiple FPGAs (e.g., 201-209), connectors (e.g., 211) and IP blocks (blocks of pre-designed circuitry, typically purchased or licensed from a vendor, e.g., blocks 213 and 215) are interconnected by wire traces (e.g., 221-237). IP blocks host pre-designed circuit modules used in the circuit; and, connectors (e.g., 211) are used to make board connections with other circuits that are not on the circuit board. Pins of an FPGA (e.g., 201) are used by wire traces for connections to different circuit containers (e.g., traces 231 to connector 211 and FPGA 201, traces 223 to FPGAs 201-209 and traces 221 to FPGAs 203 and 201). A partition solution that satisfies the constraints on the available pins does not necessarily satisfy the constraints on the available traces for implementing the nets that connect the portions of the circuit hosted on various containers. In one embodiment of the present invention, the constraints on the available traces are built in the cost function, which is minimized iteratively to obtain a partition solution. For example, in one embodiment of the present invention, a combined cost function for partitioning is in the following form.

$$C = F(C_T, C_A)$$

where $C_T$ represents the trace cost due to the excessive nets in a partition solution that can not be assigned to available traces; and, $C_A$ represents the area cost for the partition solution. The total cost of the partition is a function of trace cost and area cost. In one embodiment of the present invention, $F(C_T, C_A)$ represents a weighted summation of the trace cost ($C_T$) and the area cost ($C_A$).

Given a partitioning of the logic circuit, nets that span multiple containers to connect logic blocks assigned to different containers need to be assigned to traces. A net is connected to a container if the container has at least one logic block connected to the net. Trace assignment is performed through finding a matching trace for each net. A matching trace is a trace that can be used to implement the net. If the set of containers connected by a net is a subset of or equal to the set of containers connected by a trace, the trace is a matching trace of the net. There can be several matches for each net, which results in different net-to-trace assignments. In the present application, it is appreciated that when set $\Gamma$ is equal to set $\Omega$, set $\Gamma$ can be consider the subset of set $\Omega$; and, set $\Gamma$ can also be consider the superset of set $\Omega$.

In one embodiment of the present invention, the traces are grouped according to the sets of partitions they connect; and, the nets are also grouped according to the sets of the partitions they connect. The trace cost of the partition is the cost of all unassigned nets. For example, $$C_T = \sum_{i=1}^{i=N} f_1(n_i, m_i)$$

where $f_1(n_i, m_i)$ is the cost of unassigned nets for connecting $i^{th}$ set of partitions; $n_i$ is the number of unassigned nets for the $i^{th}$ set of partitions (e.g., $i^{th}$ net group); $m_i$ is the total number of traces that a net for $i^{th}$ set of partitions can be assigned to; and N is the total number of net groups. Thus, $m_i$ is the sum of the traces in all the trace groups that connects the sets of partitions that are equal to or the supersets of the $i^{th}$ set of partitions (e.g., for $i^{th}$ net group). The cost is zero if all the nets can be assigned. The cost increases as $n_i$ increases (e.g., $f_1$ is proportional to $n_i$). In one embodiment of the present invention, $$f_1(n_i, m_i) = \left(\frac{n_i}{m_i}\right)^2.$$

It is understood that other types of functions (e.g., with a different exponent) can also be used.

Similarly, the area cost of the partition is computed by:

$$C_A = \sum_{i=1}^{i=M} f_2(a_i, A_i)$$

where $a_i$ is the area of the logic block assigned to partition i; and, $A_i$ is the maximum area of partition i. In one embodiment of the present invention, $f_2$ $$(a_i, A_i) = \left(\frac{a_i - A_{threshold}}{A_i}\right)^2$$

for $(a_i > A_{threshold})$, where $A_{threshold}$ is the threshold area below which the area cost is 0. Thus, there is no penalty for staying within the capacity constraints. $A_{threshold}$ is typically a value equal to or less than $A_i$. However, $A_{threshold}$ can also be grater than $A_i$. A different exponent can also be used in penalizing overutilization.

Figure 3:
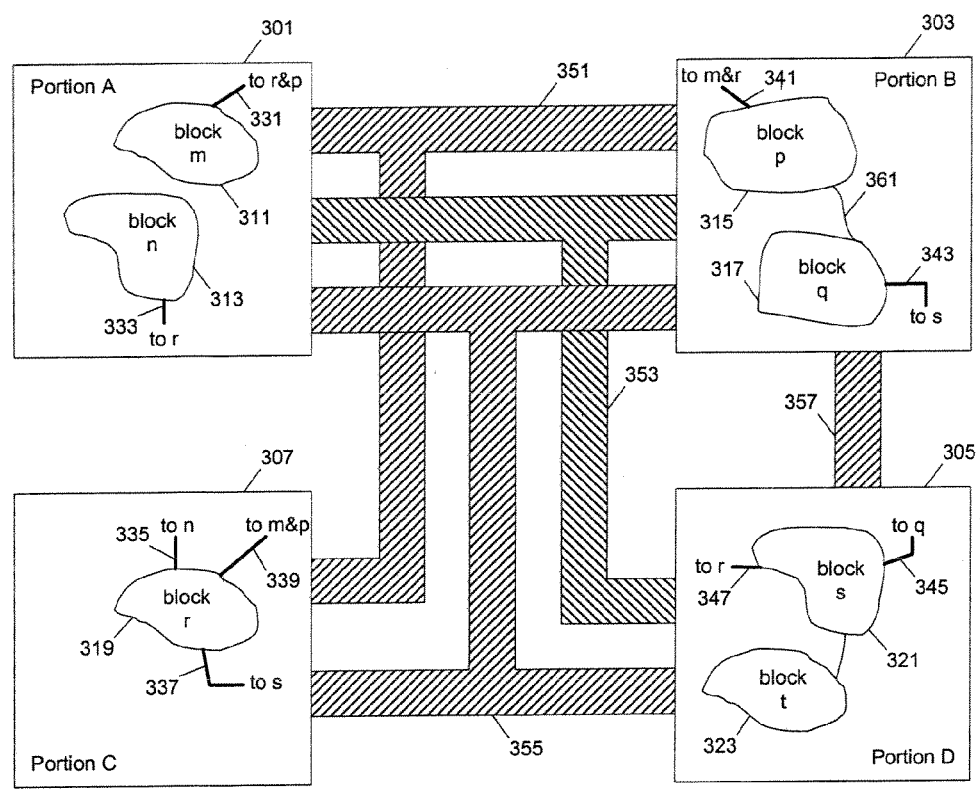
FIGS. 3-4 show an example of using a flow model to assign nets to traces according to one embodiment of the present invention.
Figure 4:
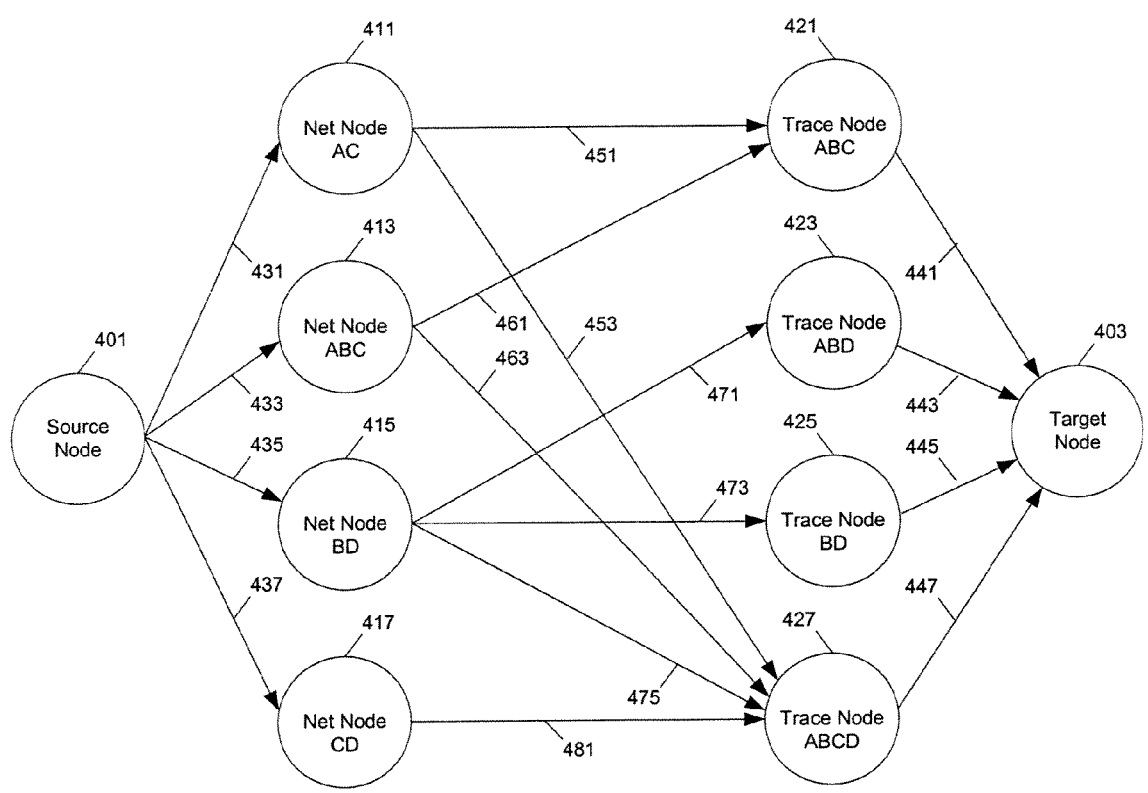

A method to find a maximum matching is used to find a trace assignment solution to maximize the number of nets that can be assigned to traces. In one embodiment of the present invention, maximum matching is found by transforming the trace assignment problem into a maximum-flow problem. A flow network is constructed, in which flows correspond to matching. In determining the cost associated with trace assignment, one embodiment of the present invention uses a flow model to assign nets to traces. FIGS. 3-4 show an example of using a flow model to assign nets to traces according to one embodiment of the present invention.

In one embodiment of the present invention, nodes are created in a flow graph to represent groups of nets and traces. After a source node and a target node are created, nets connecting the same set of partitions are grouped and represented by a net node in the flow graph. All nets in a net node connect the same set of partitions. Net edges are added from the source node to each of the net nodes; and, the capacity of each net edge is set to the number of nets represented by the corresponding net node. Nodes can be created for each net; however, grouping the nets decreases the size of the graph by a considerable amount, which decreases the complexity of the problem. Similarly, traces connecting the same set of partitions are grouped and represented by a trace node in the flow graph. All traces in a trace node connect the same set of partitions. Trace edges are added from the trace nodes to the target node; and, the capacity of each trace edge is set to the number of traces in the corresponding trace node. After creating the net nodes and trace nodes, matching edges are created between matching net nodes and trace nodes. An edge is created between a net node and a trace node if the set of partitions of a net node is equal to or a subset of the set of partitions of a trace node. The capacities of the trace edges are fixed for a given set of connections between the partitions, which limit the number of nets that can be assigned to a certain type of traces. Therefore, the capacity of the matching edge can be set to the capacity of the trace edge corresponding to the trace node. However, it is understood that the capacity of the matching edge can also be set to a number that is larger than the capacity of the trace edge corresponding to the trace node, which will not affect the resulting flow.

Variations can be used to model the flow graph. In one embodiment of the present invention, matching edges between net nodes and trace nodes are assigned a weight to prefer one matching to the other that matches the same number of nets.

The above illustrated flow diagrams show examples in which the direction of flow is from net nodes to trace nodes. However, it is understood that the direction of flow can also be set to be from the trace nodes to the net nodes. For example, in another variation, edges can be created between from the source node to the trace nodes, and from net nodes to the target node; and, matching edges can be created from trace nodes to the net nodes. A matching edge is created between a trace node and a net node if the set of partitions that the trace connects is a superset of the set of partition that the net connects. Maximum flow can be found from source to target.

FIG. 2 illustrates the situation of partitioning a circuit among FPGA chips. It is understood that varies embodiments of the present invention can be used in other circuit partitioning situations, such as multiple embedded FPGAs on an ASIC or SOC (System On Chip).

Consider a partition solution illustrated in FIG. 3, where: a) partition 301 contains blocks 311 and 313; b) partition 303 contains blocks 315 and 317; c) partition 305 contains blocks 321 and 323; and d) partition 307 contains block 319. The portions of the circuit contained within different partitions are interconnected by nets, which need to be assigned to the traces (e.g., 351-357) for a feasible implementation. For example, nets 331, 341 and 339 which interconnect blocks 311, 315 and 339 in partitions 301, 303 and 307 can be assigned to traces 351, which provides the required connectivity; and, nets 343 and 345 which connects blocks 317 and 321 in partitions 303 and 305 can be assigned to traces 353, 355 or traces 357, all of which provides wire traces between partitions 303 and 305.

In the present application, it is appreciated that a block can be a single element or a cluster of elements. Multiple elements can be grouped as a block in a clustering process before the partitioning of the circuit.

To determine a solution of assigning nets to traces, one embodiment of the present invention uses a flow model. Traces are grouped according to the partitions they connect. For example, traces 351 connect partitions 301 (A), 303 (B) and 307 (C); and, trace node 421 (ABC) is created in the graph in FIG. 4 to represent the trace group. Similarly, traces 353 are represented by trace node 423 (ABD) to indicate the connection between partitions 301 (A), 303 (B) and 305 (D); and, traces 355 and 357 are represented by trace nodes 427 and 425 respectively.

Similarly, nets are grouped according to the partitions in which the portions of the circuit they connect are contained. For example, nets 331, 341 and 339 connect the portions of the circuit that are in partitions 301 (A), 303 (B) and 307 (C); and, net node 413 (ABC) is created in the graph in FIG. 4 to represent the net group. Similarly, nets 333 and 335 are presented by net node 411 (AC) to indicate the connection required for the portions of the circuits contained in partitions 301 (A) and 307 (C).

In one embodiment of the present invention, source node 401 is connected to each net nodes through a net edge (e.g., 431-437) to conduct flow from the source node into the net node; and, target node 403 is connected to each trace node through a trace edge (e.g., 441-447) to conduct from the trace node into target node. A net node matches a trace node when a net represented by the net node can be assigned to a trace represented by the trace node. A matching edge can be used to connect a net node to a matched trace node to allow flow from the net node to the trace nodes. For example, a net of net node 411 (AC) can be assigned to a trace of trace node 421 (ABC) or trace node 427 (ABCD); thus, matching edges 451 and 453 are used to connect net node 411 to trace nodes 421 and 427.

In one embodiment of the present invention, the flow capacity of the net edges (e.g., 431-437) are determined by the number of nets represented by the corresponding net nodes their connect; and, the flow capacity of the trace edges (e.g., 441-447) are determined by the number of traces represented by the corresponding trace nodes they connect. The reverse capacities (i.e., the capacities from the net nodes to the source, from the trace nodes to the net nodes, and from the target node to the trace nodes) of these edges are all zero. The flow in the matching edges from the net nodes to the trace nodes represents a solution for assigning the nets to the traces. It is understood that, in the graph of FIG. 4, no total backward flow is allowed in any of the edges for a trace assignment solution (since reverse capacities are zero—such a situation does not have corresponding meaning in assigning nets to traces).

In one embodiment of the present invention, there is no limit on the flow capacity of the matching edges. In an alternative embodiment of the present invention, the flow capacity of each matching edge is set to the flow capacity of the corresponding trace edge which connects to the trace node that the matching edge connects (e.g., the capacity of edge 453 is equal to the capacity of edge 447). It is understood that various modifications to the graph in FIG. 4 can be done without departing from the spirit of the graph in FIG. 4. For example, a modified graph may not have a source node and net edges, where each net node is a source of flow with the maximum allowable outflow limited to the number of nets represented by the net node. Similarly, a modified graph may not have a target node and trace edges, where each trace node is a sink of flow with the maximum allowable inflow limited to the number of traces represented by the trace node. Further, a modified graph may not have all the possible matching edges.

In the graph in FIG. 4, each net node and trace node has equal amount of total inflow and outflow. Thus, the property of flow conservation is preserved at each net node and at each trace node.

Figure 5:
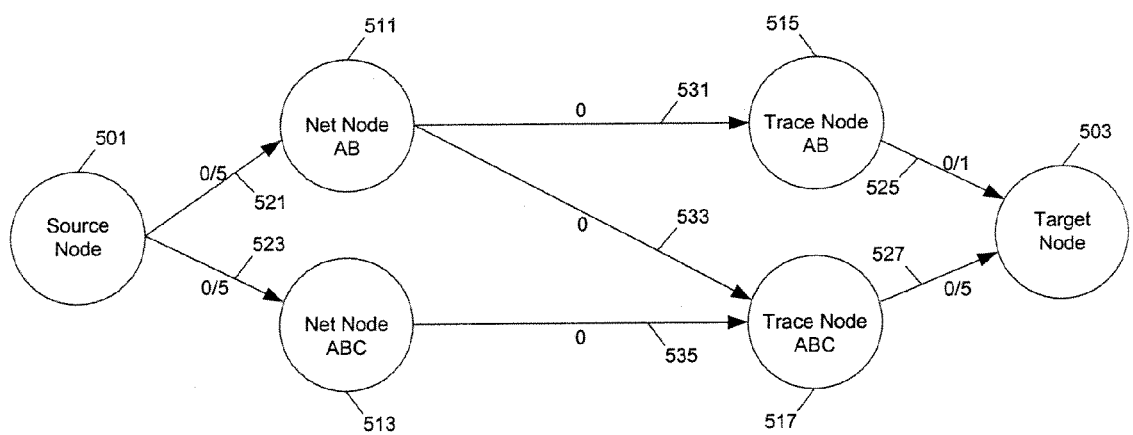
FIGS. 5-7 illustrate a method to maximize flows in a flow model to assign nets to traces according to one embodiment of the present invention.
Figure 6:
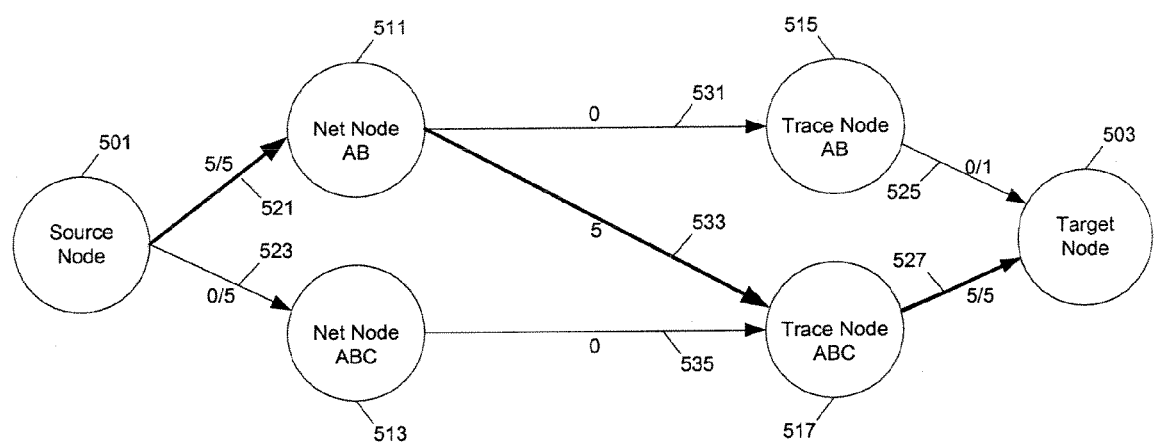
Figure 7:
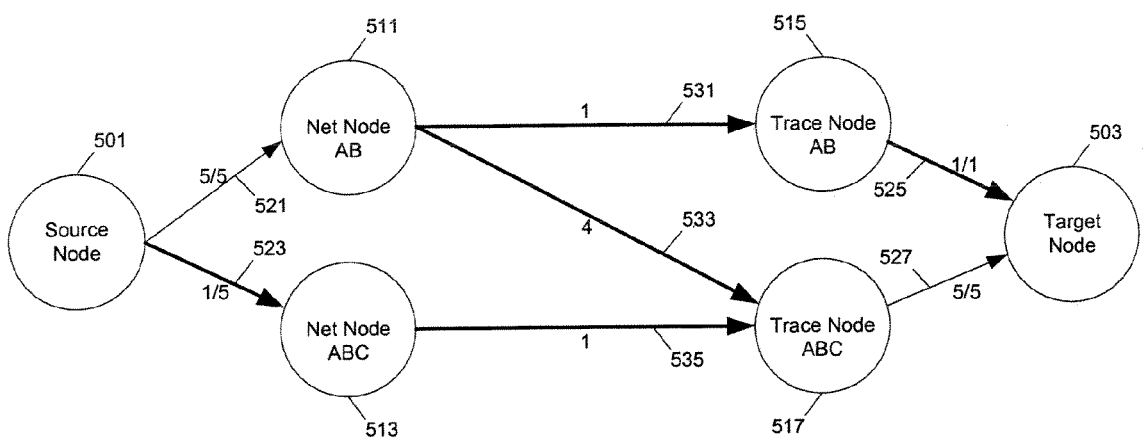

In one embodiment of the present invention, the flow maximization algorithm is used to maximize the flow in the graph of a flow model to assign nets to traces. FIGS. 5-7 illustrate a method to maximize flows in a flow model to assign nets to traces according to one embodiment of the present invention. FIG. 5 illustrates the situation when there is no flow in the graph. Each of net edges 521 and 523 has a capacity of 5; and, trace edges 525 and 527 have capacities 1 and 5 respectively. To maximize the flow in the graph, a first path (e.g., 501, 521, 511, 533, 517, 527 to 503) is found to push flow from the source node to the target node, as show in FIG. 6. In one embodiment, a path that allows more flow is used first. FIG. 7 shows an example of pushing additional flow from the source node to the target node. An augmenting path (e.g., 501, 523, 513, 535, 517, 533, 511, 531, 515, 525 and 503) is found by searching a path in the graph from the source node to the target node, where the path can be in a backward direction in a matching edge, going from a trace node back to a net node, if the matching edge currently contains positive flow. The flow that can be pushed through the augmenting path is the minimum of the residual capacity of the edges in the path, where the residual capacity of the backward edge in the path is the amount of existing flow in the edge. Thus, the backward flow in the matching edge cancels a portion of the existing flow in the matching edge. For example, matching edge 533 in FIG. 6 has a flow of 5, which may be canceled by a backward flow in the augmenting path in FIG. 7. When an additional flow of 1 is added to the augmenting path in FIG. 7, the total flow on edge 533 becomes 4. In finding an augmenting path, a loop is avoided by finding the next node on the graph that is not already on the path. The total flow in the graph is thus increased from 5 to 6. The process of finding an augmenting path can be repeated until no such path can be found. When no augmenting path exists, the flow in the graph reaches a maximum value.

Figure 8:
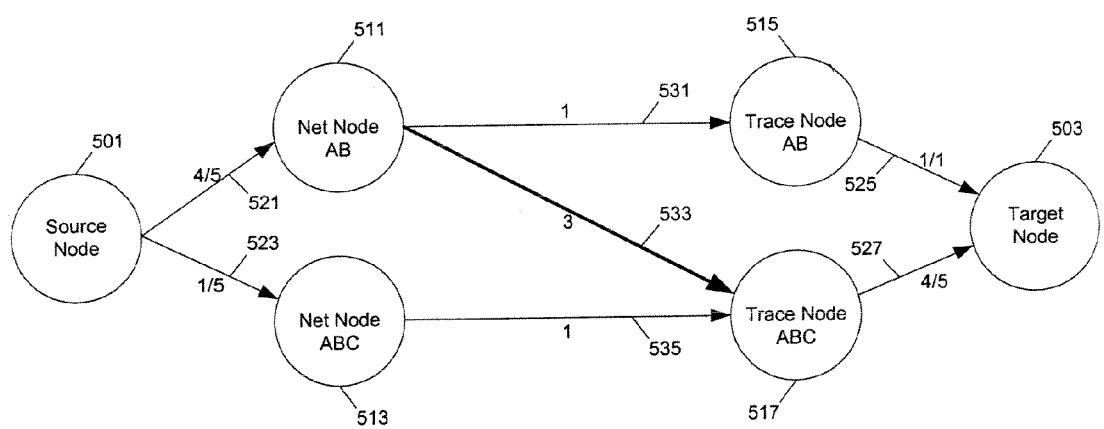
FIGS. 8-9 illustrate a method to determine alternative maximum trace assignment using a flow model according to one embodiment of the present invention.
Figure 9:
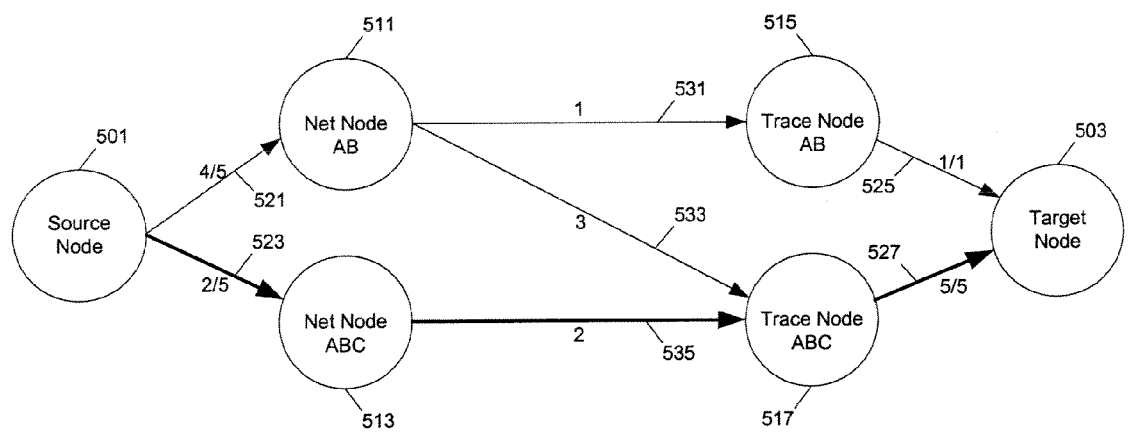

FIGS. 8-9 illustrate a method to determine alternative maximum trace assignment using a flow model according to one embodiment of the present invention.

In one embodiment of the present invention, the cost for trace assignment depends also on how the unassigned nets are distributed amount different net groups. Thus, alternative maximum flow patterns in the graph can be found to search for a solution with minimum trace cost. FIG. 8 shows a situation where the flow on matching edge 533 is decreased by one unit to make room for finding an alternative augmenting path. The flow in the graph is updated accordingly after the flow in matching edge 533 is decreased by one unit. FIG. 9 shows an alternative augmenting path (e.g., 501, 523, 513, 535, 517, 527 and 503) that does not go through the matching edge 533. Thus, from the solution in FIG. 8 and FIG. 9, a number of alternative maximum flow patterns can be determined. In one embodiment of the present invention, the trace cost is reduced (or minimized) in the processing of finding alternative maximum flow patterns.

Thus, the trace assignment cost can be computed from the flow graph by running any maximum flow algorithm. Any IP module in the design corresponding to an IP block on the board will guide the trace based combined cost partitioner to partition logic blocks connected to the IP module, to the chips connected to the IP block on the board. Traditional partitioning methods, which do not take traces into account, will not be able to take advantage of the connectivity of the board and may fail to partition the logic blocks to the chips connected to the IP block on the board.

From this description, a person skilled in the art understands that a trace assignment solution can be determined from such a flow model. Various flow maximization algorithms known in the art (e.g., the augmenting path of Lestor R. Ford, Jr., and D. R. Fulkerson, described in "Flows in Networks", Princeton University Press, 1962; the shortest path of Jack Edmonds and Richard M. Karp, described in "Theoretical improvements in the algorithmic efficiency for network flow problems", Journal of the ACM, 19:248-264, 1972; the preflow-push method of Andrew V. Goldberg and Robert E. Tarjan, described in "A new approach to the maximum flow problem", in proceedings of the Eighteenth Annual ACM Symposium on Theory of Computing, pages 136-146, 1986; and others) can be used in obtaining a trace assignment solution. Further, a trace assignment solution can be obtained by solving the following maximization problem using mathematical techniques such as integer linear programming.

$$\text{Max} \sum_{i=1}^{i=M} \sum_{j=1}^{j=N} M_{ij}$$

Where $M_{ij}$ represents the number of traces assigned from the $i^{th}$ net group to the $j^{th}$ trace group; $M_{ij} \geq 0$ if the $i^{th}$ net group matches the $j^{th}$ trace group; $M_{ij}=0$ if the $i^{th}$ net group does not match the $j^{th}$ trace group;

$$\sum_{j=1}^{j=N} M_{ij} \leq N_i;$$

$N_i$ represents the number of nets in the $i^{th}$ net group;

$$\sum_{i=1}^{i=M} M_{ik} < T_k;$$

and, $T_k$ represents the number of nets in the $k^{th}$ trace group.

Alternatively, the trace cost function can be minimized to assign the nets to traces. For example, $$\text{Min} C_T, \text{ where } C_T = \sum_{i=1}^{i=N} f_1(n_i, m_i), \text{ and } n_i = \left( N_i - \sum_{j=1}^{j=N} M_{ij} \right).$$

where $C_T$ is the total trace cost function.

One embodiment of the present invention uses an incremental algorithm (e.g., based on the flow model, or based on the integer linear programming model) to compute trace cost function $C_T$, in which the trace assignment solution before a modification (e.g., moving a block from one partition to another) made to the partitioning solution is used as the starting point for the search for the trace assignment solution after the modification for the new partitioning solution. Since the incremental algorithm is used, the computation of the solution to the trace assignment after the modification can be shortened.

In one embodiment of the present invention, modifications to a partition scheme are made to search for a best partitioning solution that minimizes the cost function. When a partition scheme is modified, the flow graph for the previous trace assignment solution is modified and used as a starting point in the flow maximization process to obtain a trace assignment solution for the current partitioning scheme. The flow maximization process does not start from the graph of zero flow.

Figure 10:
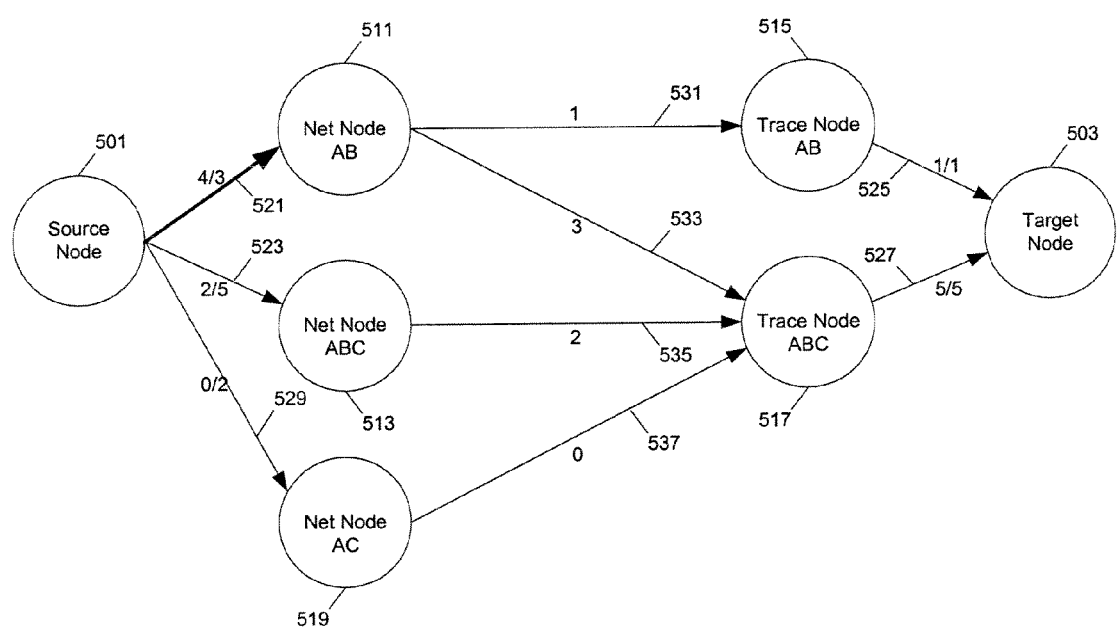
FIGS. 10-12 illustrate a method of incrementally updating a flow model to determine a trace assignment after making a modification to a partition scheme according to one embodiment of the present invention.
Figure 11:
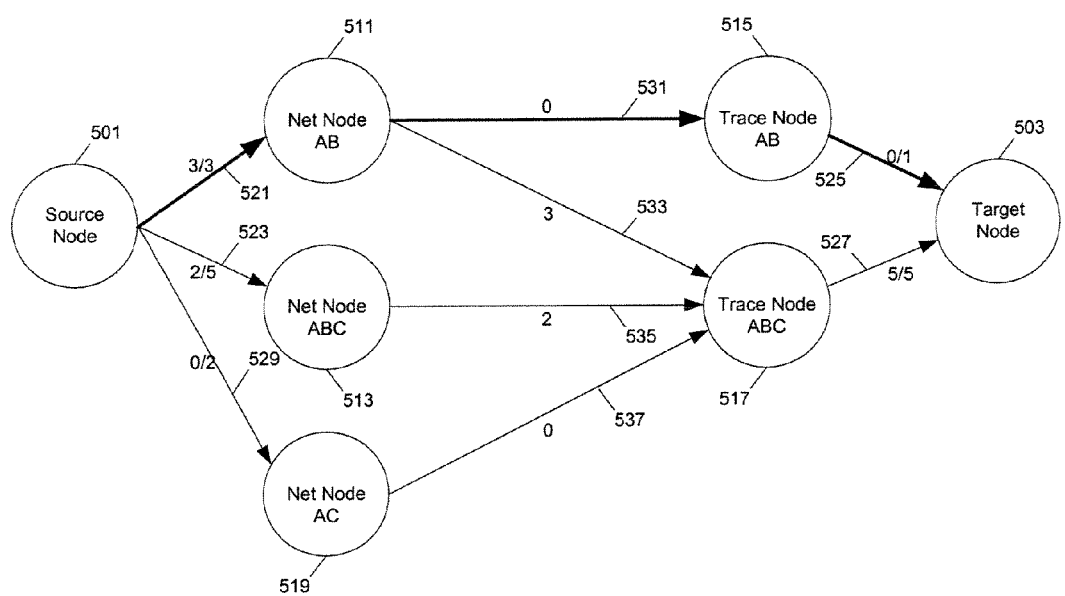
Figure 12:
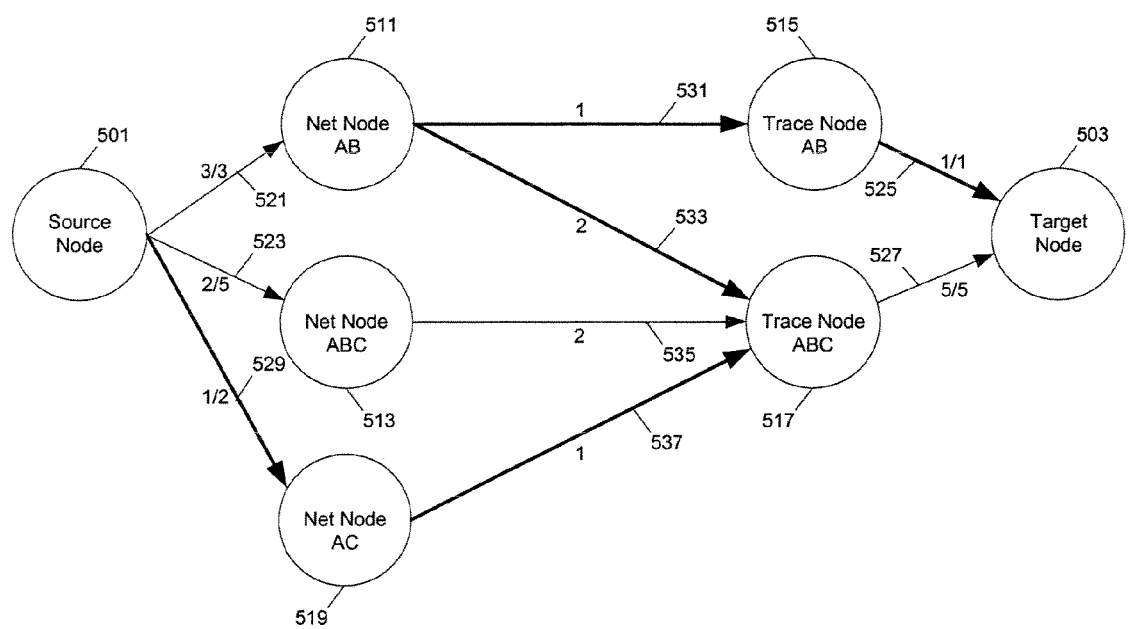

FIGS. 10-12 illustrate a method of incrementally updating a flow model to determine a trace assignment after making a modification to a partition scheme according to one embodiment of the present invention. FIG. 10 shows the situation when the graph is updated according to a new partition scheme from the graph in FIG. 9, after a partitioning solution is modified. In FIG. 10, capacity of net edge 421 is decreased since the modification decreases the number of nets for net node 511. New net node 519 is added to graph due to a new group of nets caused by the modification to the partition scheme. The capacity of a net edge may be decreased to zero, when there is no net left in the corresponding net group; and, in this case, the corresponding net node may be deleted. Typically, the available traces do not change when the partition solution is changed. However, if the available traces change when the partition solution is modified (e.g., when more routing resources become available at certain area for connectivity among regions on a chip), the trace nodes and capacities of the trace edges may also be changed.

After the topology and capacity constraints are changed in the graph, due to the modification to the partitioning solution, the flow in the new graph can be updated and maximized. For example, net edge 521 has excessive flow. Thus, a path from the source node to the target node can be found to remove (or redirect) the excessive flow. For example, in FIG. 11, path 501, 521, 511, 531, 515, 525 and 503 is found to remove the excessive flow. Similar to finding an augment path, a path that removes the excessive flow can be found by going forward on a matching edge where the matching edge currently has positive flow. Multiple paths may be used to remove the excessive flow on one net edge. Once the excessive flows are removed, the process of finding an augmenting path can be repeated until no augmenting path can be found. For example, path 501, 529, 519, 537, 517, 533, 511, 531, 515, 525 and 503 allows additional flow by passing through net edge 529 and trace edge 525 and by canceling a portion of the flow in matching edge 533.

Figure 13:
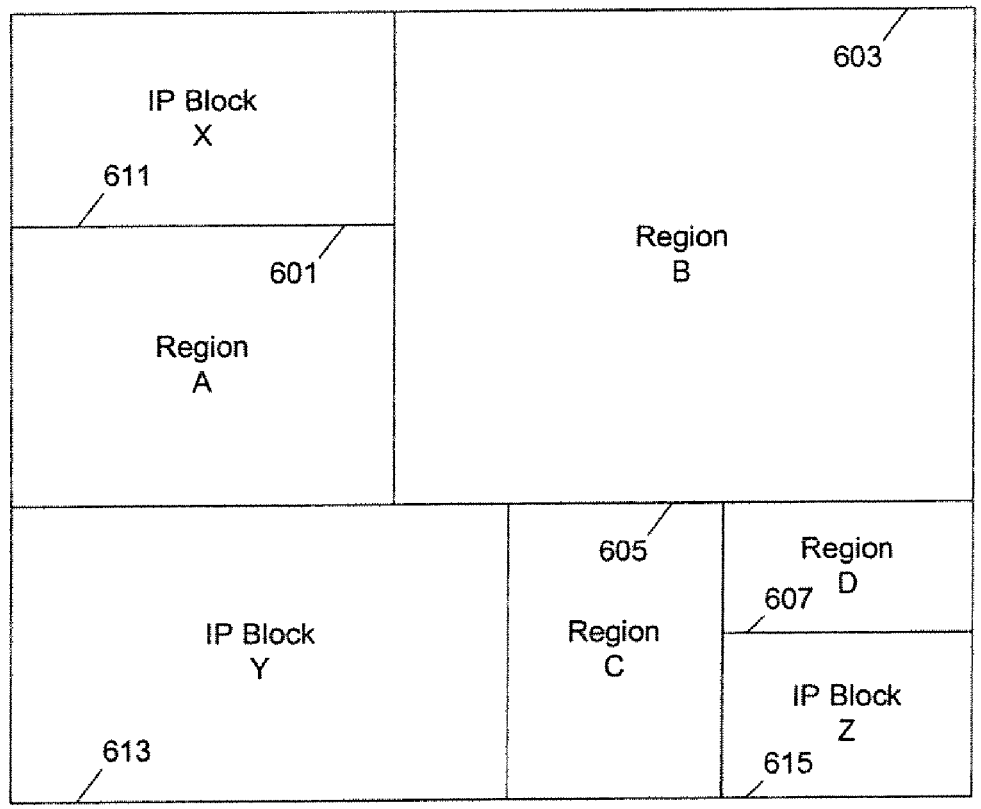
FIG. 13 shows an example of partitioning a circuit into multiple regions on a chip according to one embodiment of the present invention.

FIG. 13 shows an example of partitioning a circuit into multiple regions on a chip according to one embodiment of the present invention. In FIG. 13, a chip is partitioned into multiple regions and IP blocks. Chip wiring is available to connect the multiple regions and IP blocks. Each region is a container; and, the wiring capacity between adjacent regions can be estimated according to the length of the boundary between the regions.

Figure 14:
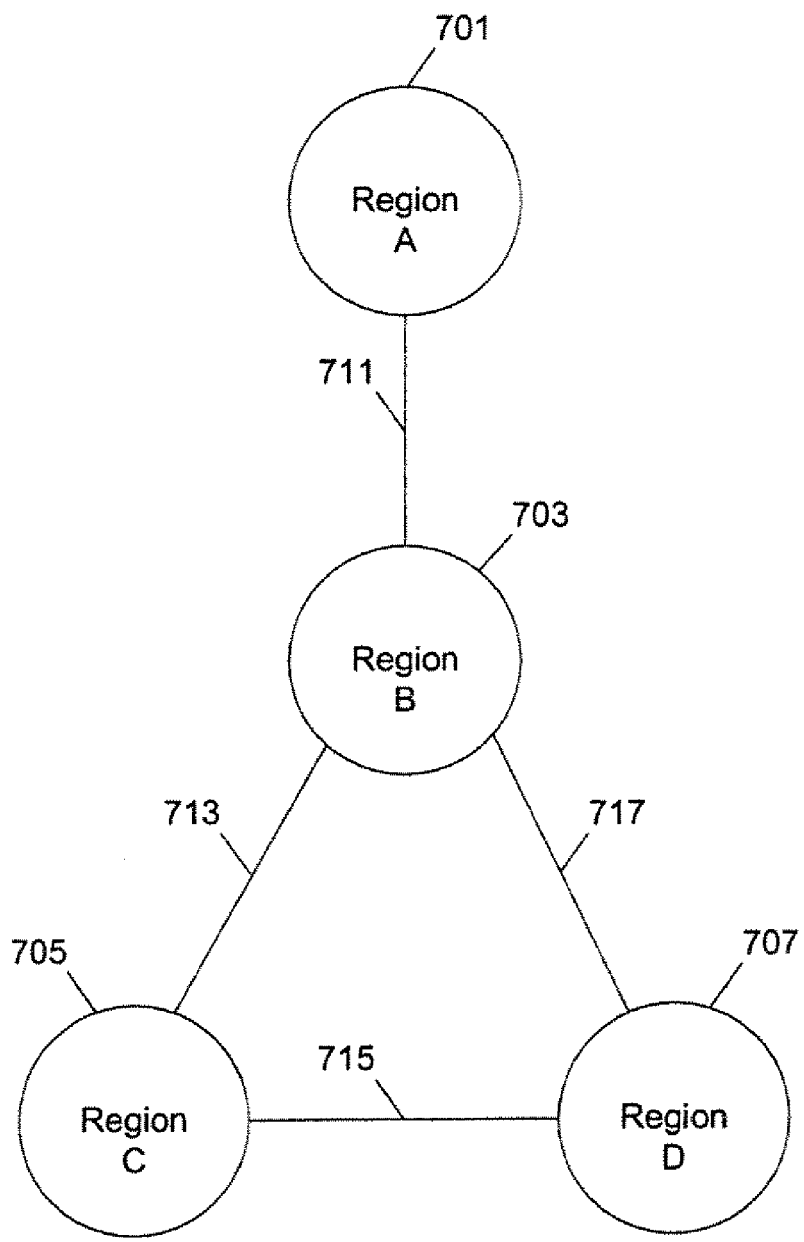
FIG. 14 shows a connectivity graph of the regions in FIG. 13.

Logic blocks assigned to non-adjacent regions need to connect indirectly through some intermediate regions using feedthrough. A connectivity graph that shows the connectivity between regions can be used to obtain various possible feedthrough solutions to interconnect two or more regions for nets that connect portions of the circuit in these regions. FIG. 14 shows a connectivity graph of the regions in FIG. 13. In FIG. 13, the IP blocks are not shown in the connectivity graph. In general, the portions of the circuit in the IP blocks are fixed; the nets connecting the portions of the circuit in the IP block can be assigned to traces or groups of traces that have the IP block as one end point; and, the IP blocks cannot be used to route through them. It is understood that if an IP block allows feedthrough, such an IP block can be treated as a regular region for finding feedthrough solutions; and, the appropriate connectivity capacities can be defined for those regions. The nodes in the connectivity graph represent the regions; and, the edges in the connectivity graph represent the wiring resources (traces) between the adjacent regions. For example, nodes 701-707 in FIG. 14 represents regions 601-607 in FIG. 13 respectively; and, edge 711 in FIG. 14 represents the wiring resource between regions 601 and 603 (e.g., estimated from the length of the common boundary between regions 601 and 603 in FIG. 13).

Figure 15:
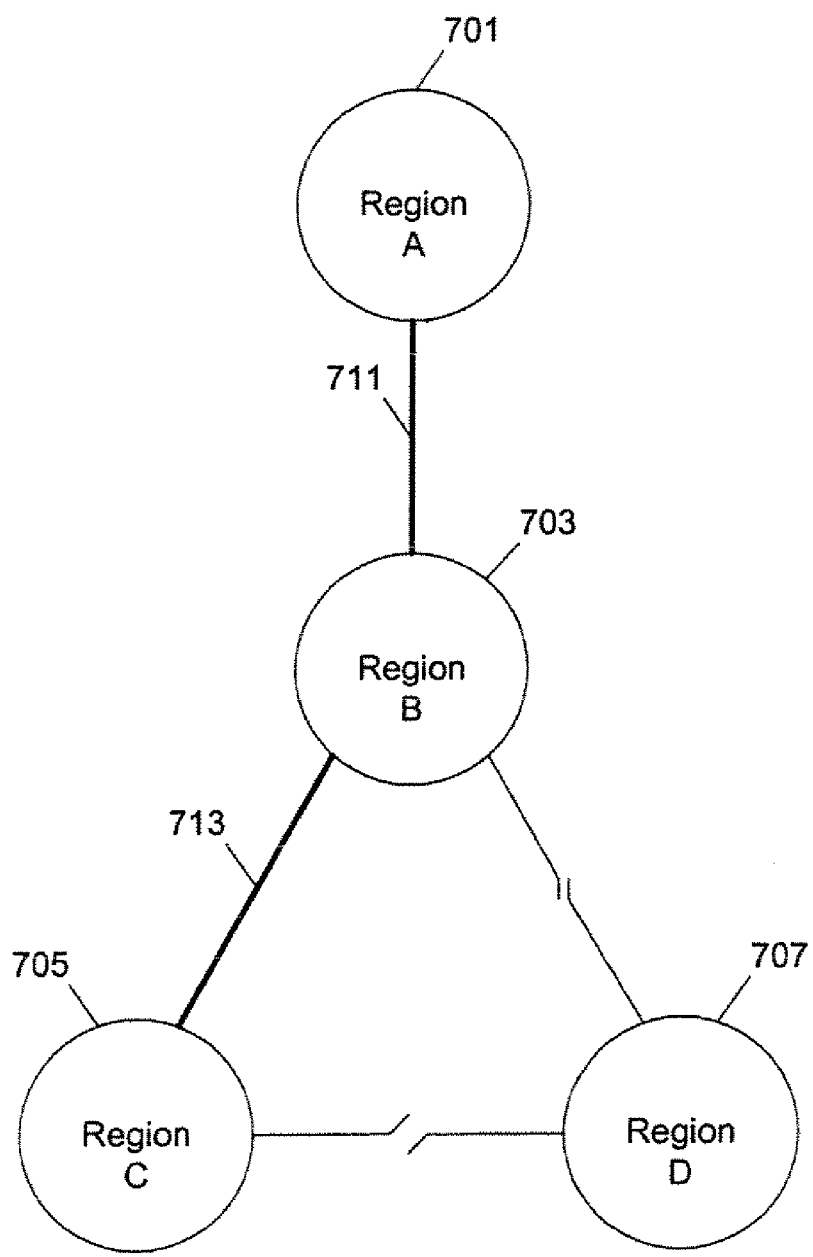
FIGS. 15-17 show methods for determining groups of traces for interconnecting regions that are not directly connected.
Figure 16:
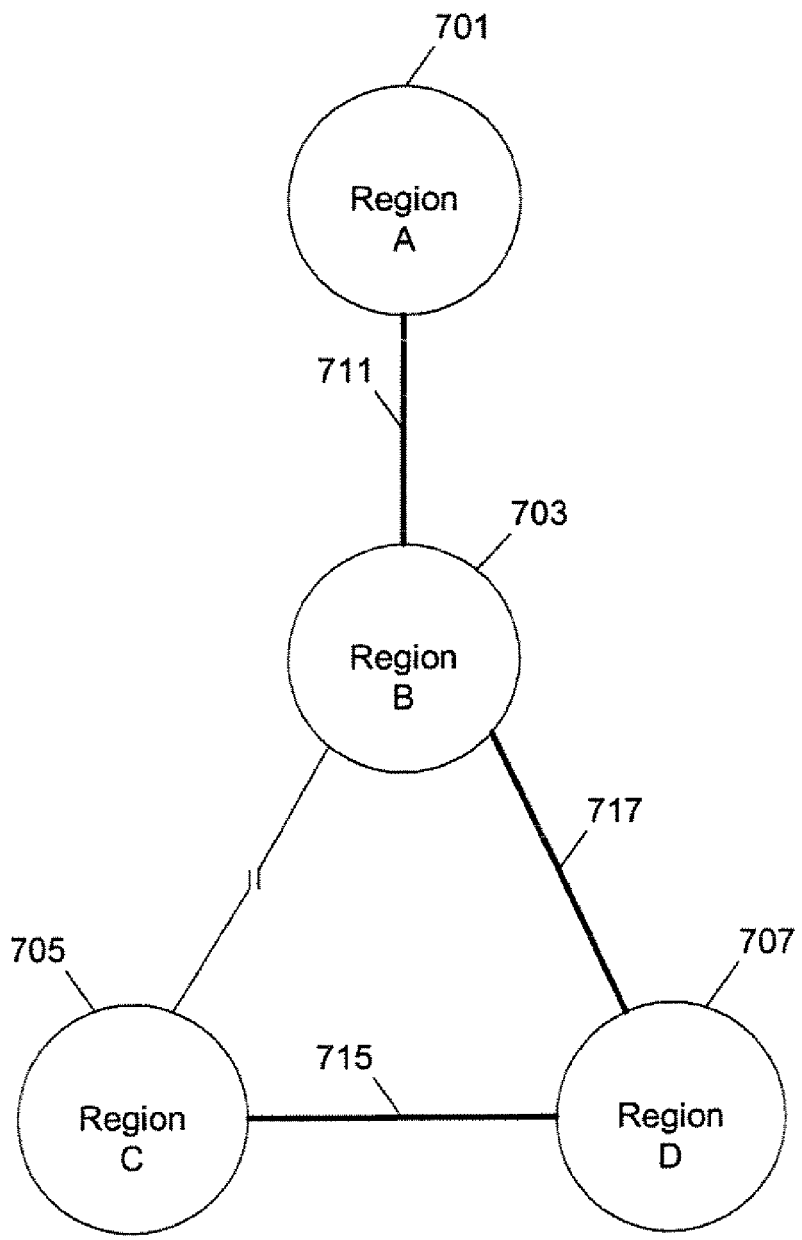
Figure 17:
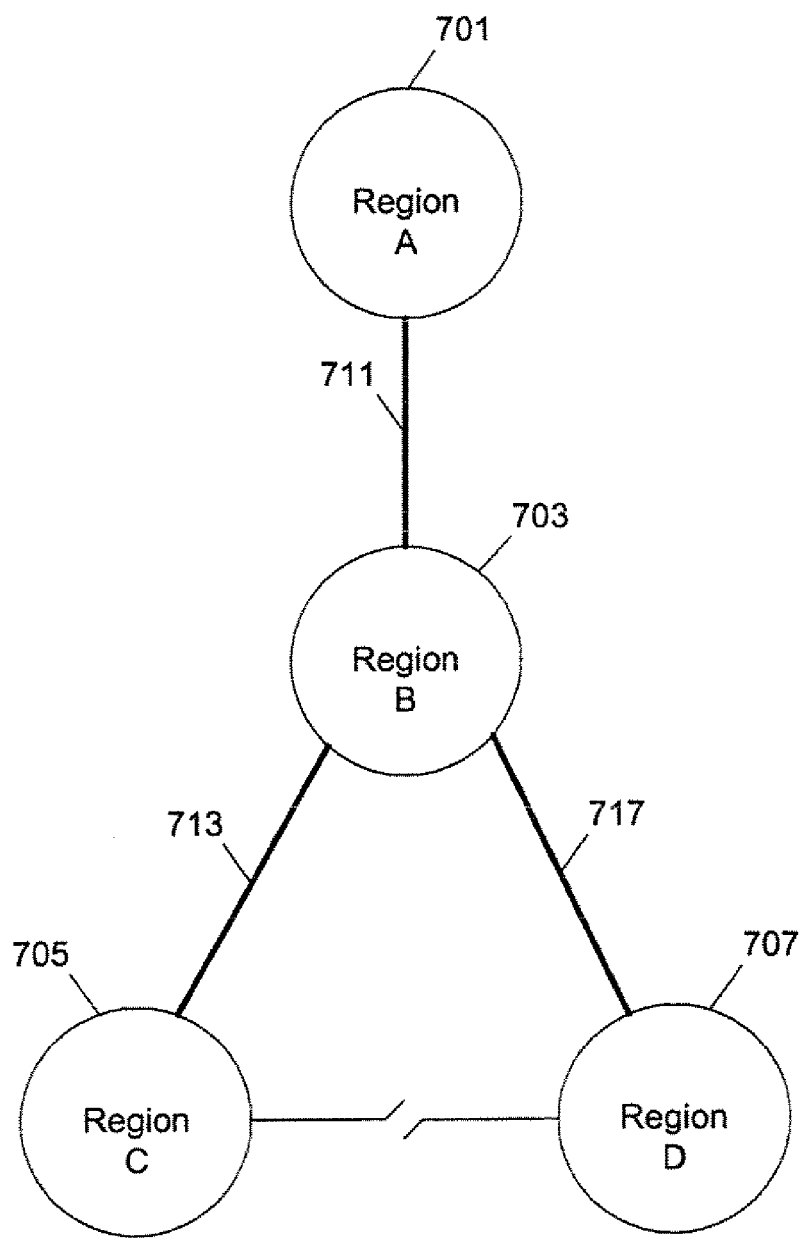

Connectivity between non-adjacent regions can be realized by finding a set of interconnected nodes (e.g., a tree or a path) in the graph that connect the nodes representing the regions. In one embodiment of the present invention, only trees, which contain no cycles, that connect the required nodes are selected as possible feedthrough solutions, since a set of interconnected nodes with one or more cycles can be converted into a tree by removing one or more edges. A such generated tree provides the same type of connection with less wiring resources than the original set of interconnected nodes with one or more cycles FIGS. 15-17 show methods for determining groups of traces for interconnecting regions that are not directly connected. In FIG. 15, to find a feedthrough solution to connect regions A and C of FIG. 14 (represented by nodes 701 and 705 in FIG. 15), a path from node 701 to node 705 is found (e.g., path 701, 711, 703, 713 and 705). Thus, a net connecting regions A and C can be assigned to a trace represented by edge 711 and a trace represented by edge 713 by feedthrough region B (represented by node 703). In general, a net can be assigned to a combination of traces from different traces groups using feedthrough. From this description, it is understood that feedthrough can also be used with other types of containers, such as partitions on circuit board, FPGAs, and others. Since path 701, 711, 703, 713 and 705 connects regions A, B and C, it represents a trace group that is based on feedthrough using trace groups represented by edges 711 and 713. FIG. 16 illustrates another path (701, 711, 703, 717, 707, 715, 705) in the connectivity graph that connects regions A and C; and, the path provides connectivity for regions A, B, C and D as well. In one embodiment of the present invention, after a path is found to connect regions A and C (e.g., as shown in FIG. 15), an additional path is found from an additional node that is not already on the path to a node on the path to obtained a feedthrough solution for the additional node. For example, in FIG. 17, additional path 707, 717 and 703 is found to add additional node 707 into the feedthrough solution so that the feedthrough tree (e.g., nodes 701-707 connected by edges 711, 713 and 717) provides connectivity for regions A, B, C and D. In general, different trees can be found on a connectivity graph for connecting the same set of nodes; and, these trees can be used in further assignment of nets to traces, which is described below.

In general, there are several trees in a graph connecting a set of nodes, which represent the partitioned regions. Some edges in a tree can be redundant so that removing the edge will not break the connectivity between the set of nodes. In one embodiment of the present invention, only minimal trees that have no redundant edges are used as feedthrough solutions to realize the required connectivity among the set of regions.

Figure 18:
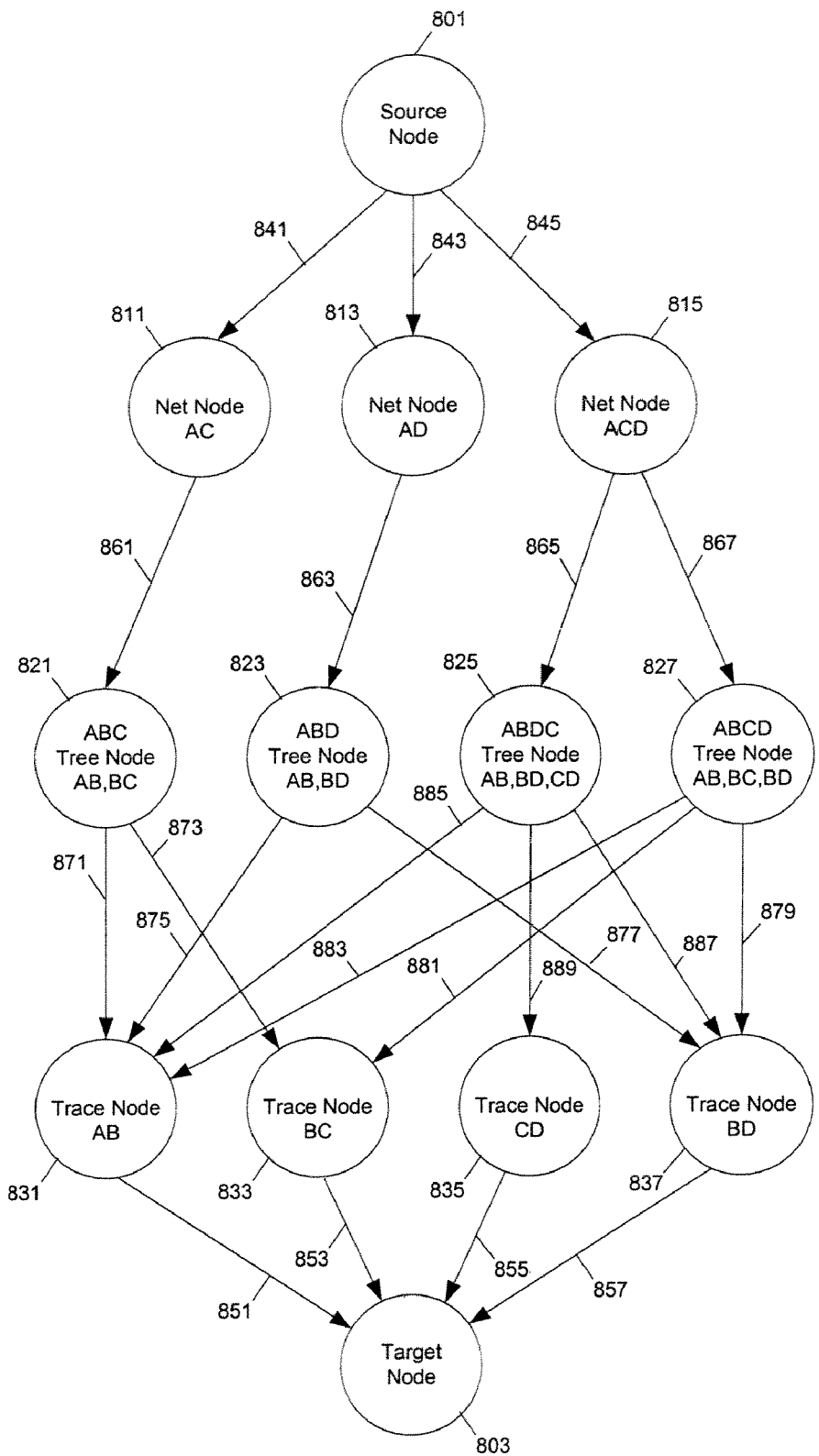
FIG. 18 shows one example of flow model to assign nets to traces according to one embodiment of the present invention.

FIG. 18 shows one example of flow model to assign nets to traces according to one embodiment of the present invention. In FIG. 18, source node 801 and target node 803 represent the starting and ending point of the flow in the graph. Net nodes 811-815 represent the nets in the partition solution that connect portions contained within different containers (regions, chips, or others). For example, net node 811 represents nets that connect regions A and C of FIG. 13). Net edges (e.g., 841-845) connect the net nodes to the source node to allow flow into each net node according to the number of nets represented by the corresponding net node. Trace nodes (e.g., 831-837) represent the trace connections (wiring resource) available for interconnect the regions. For example, trace node 831 represents the chip wiring resource available for connecting regions A and B of FIG. 13. Trace edges (e.g., 851-857) connect the trace nodes to the target node to allow flow into the target node from each trace node according to the wiring resource available for the corresponding trace node.

Further, tree nodes (e.g., 821-827) represent possible feedthrough solutions for trace assignment. For example, trace node 821 represents feedthrough solution illustrated in FIG. 15, in which traces from trace nodes 831 and 833 (corresponding to edges 711 and 713 in FIG. 15) are used to provide a feedthrough solution. Thus, tree edges 871 and 873 connects trace node 821 to trace nodes 831 and 833 to represent dependence on the corresponding trace node. Similarly, tree node 825 corresponds to the feedthrough solution in FIG. 16, depending on trace nodes 831, 835 and 837; and, tree node 827 corresponds to the feedthrough solution in FIG. 17.

Matching edges (e.g., 861-867) connects net nodes to tree nodes or trace nodes to represent possible assignment of net to traces. For example, a net connecting regions A and C, which is represent by net node 811, can be assigned to a feedthrough solution represented by tree node 821; thus, matching edge 861 connects net node 811 to tree node 821 to allow flow (assignment of net to trace).

In one embodiment of the present invention, not all possible matching edges are present in the flow graph. For example, a flow from net node 811 to tree node 825 is possible. However, tree node 821 provides an outlet for net node 811; and, tree node 821 depends on a subset of the trace edges on which tree node 825 depends. Thus, a flow from node 811 through tree node 825 always requires more resources than a flow through tree node 821. Therefore, including a matching edge connecting net node 811 and tree node 825 would not improve the trace assignment solution, in the presence of matching edge 861. Thus, some matching edges can be excluded from the flow graph to simplify the graph and reduce the computation time for maximizing the flow in the graph (e.g., without degrading the quality of the solution.

Although flow conservation is preserved at each net node and at each trace node, a tree node that depends on two or more trace nodes in general does not have equal inflow and outflow. The inflow on each tree node is pushed to all the outgoing tree edges of the tree node, since all the trace nodes of the tree node are relied upon for each net (connection) assigned to the tree node. For example, one net assigned to tree node 821 requires one trace from each of trace nodes 831 and 833. Thus, an amount of flow into tree node 821 causes the same amount of flow onto each of tree edges 871 and 873. A tree node generates flow according to the amount of inflow. Therefore, the inflow and the outflow are not equal for the tree nodes; and, a typical maximum flow algorithm known in the art does not apply to such a flow graph with a tree node. Since the tree nodes generate additional flow, the outflow from the source node is also not equal to the inflow into the target node.

In one embodiment of the present invention, no matching edge is used to connect a net node to a trace node directly. Instead, a matching edge connects the net node to a tree node that depends only on the trace node. Thus, matching edges connects only the net nodes and tree nodes in the graph. In searching for an augmenting path from the source node to the target node, the additional flow in the augmenting path may go through multiple net nodes, tree nodes and matching edges until reach a tree node that depends on a set of trace nodes each of which allows additional flow. For example, since tree node 821 depends on trace nodes 831 and 833, inflow into tree node 821 reach target node 803 only if both trace edges 853 and 851 allow additional flow; and, the additional flow is limited by the least amount of addition flow allowed in trace edges 853 and 851 (and by other capacity restrictions on the path).

From this description, a person skilled in the art understands various modifications to the graph in FIG. 18 can be made without departing from the spirit of the graph in FIG. 18. For example, the target node and the trace edges may be removed by converting the trace nodes as sinks for the flow; or, the source node and net edges may be remove may be removed by converting the net nodes as sources for the flow. In a further embodiment of the present invention, a net node can be directly connected to a trace node through a matching edge.

Figure 19:
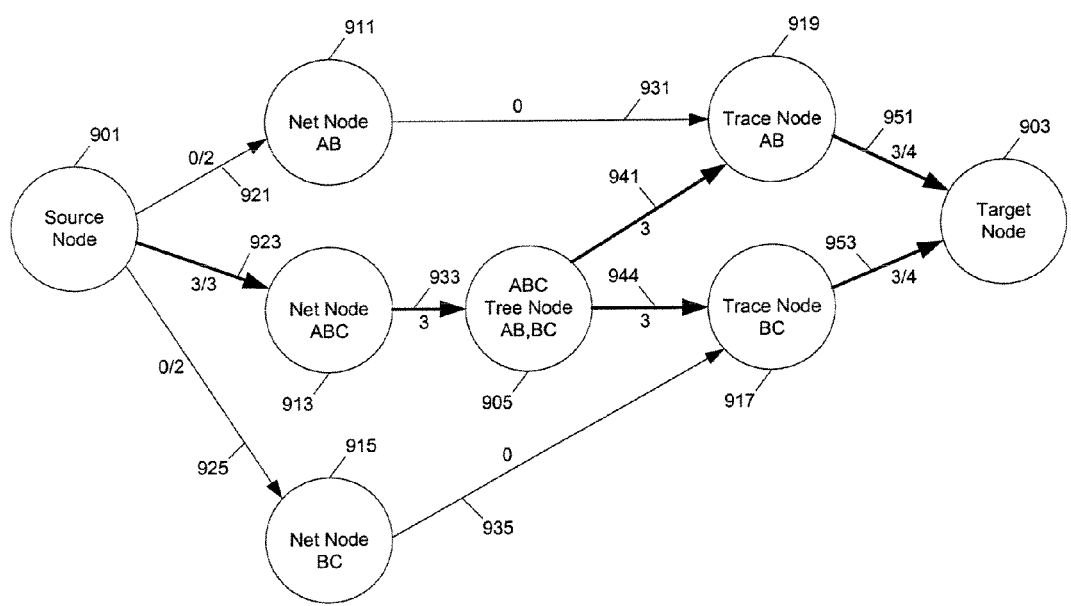
FIGS. 19-22 show examples of maximizing flow in a flow diagram to assign nets to traces according to embodiments of the present invention.
Figure 20:
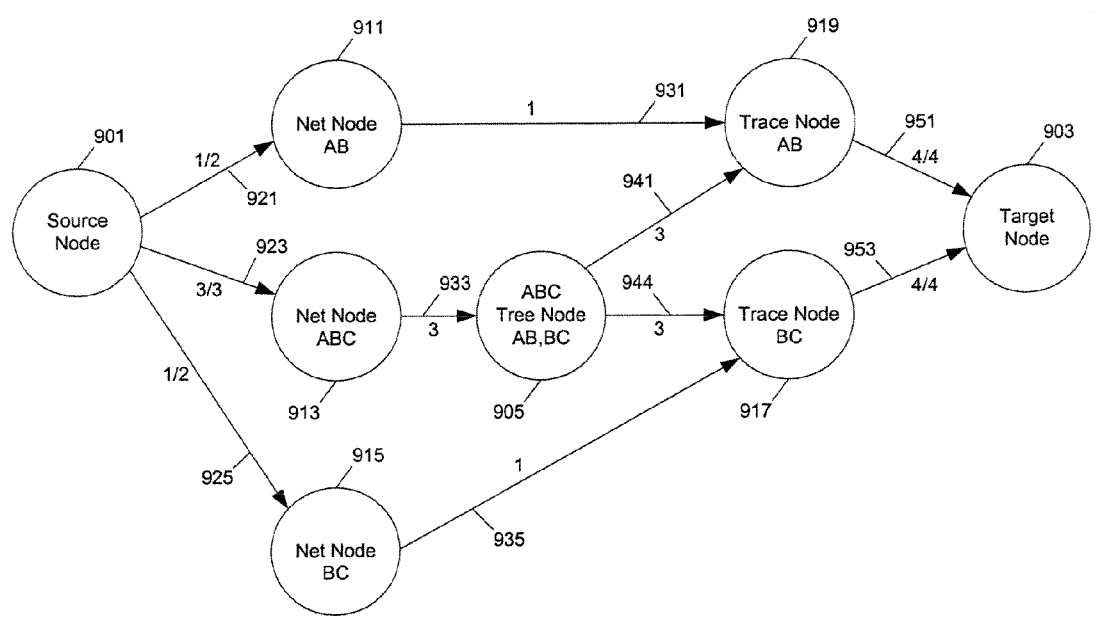
Figure 21:
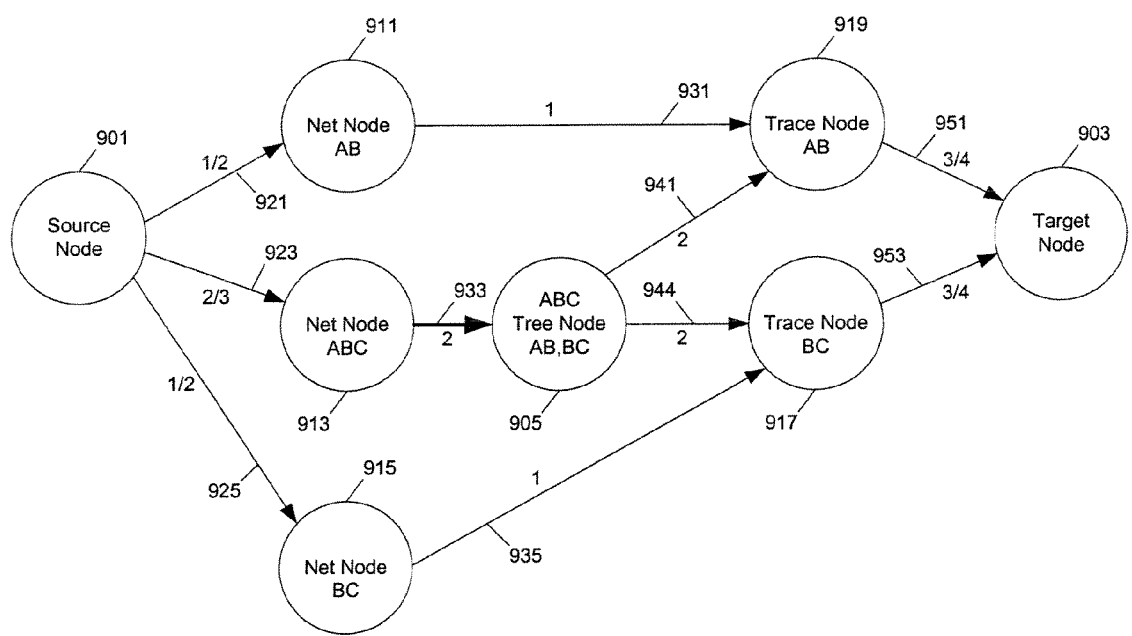
Figure 22:
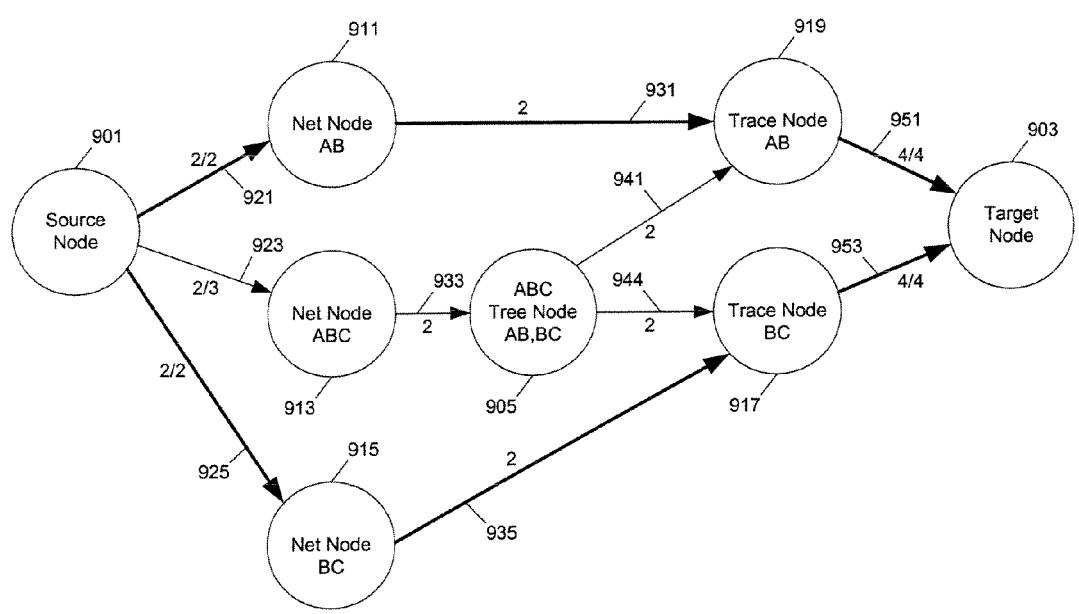

FIGS. 19-22 show examples of maximizing flow in a flow diagram to assign nets to traces according to embodiments of the present invention. In FIG. 19, an augmenting path (901, 923, 913, 933, 905 {944 and 941}, {917 and 919}, {953 and 951}, and 903) is found to allow flow from the source node to the target node. Since tree node 905 depends on trace nodes 919 and 917, the augmenting path has parallel branches (905, 941, 919, 951, 903) and (905, 944, 917, 953, 903) that conducts the same amount of flow fed into tree node through matching edge 933; each of the branches allows the same amount of flow to pass to allow the amount of inflow into tree node 905. After additional flows are introduced into net edges 921 and 925, FIG. 20 shows a flow pattern based on which an augmenting path cannot be found. However, different flow patterns that allow the same amount flow or more flow may be found by trading flows on different paths, since some tree nodes depend on more traces nodes than others. To find alternative maximum solutions, the flow on one matching edge to a tree node may be decreased to make room for finding other augmenting paths. In FIG. 21, the flow on matching edge 933 is reduced by one unit; and, the flow in the graph is updated accordingly. After the flow on matching edge 933 is reduced by one unit, two augmenting paths (e.g., {901, 921, 911, 931, 919, 951, 903} and {901, 925, 915, 935, 917, 953, 903} are found in the graph that allow additional flow, as illustrated in FIG. 22.

In one embodiment of the present invention, the cost function for trace assignment is evaluated to find the best solution by minimizing the trace cost during finding alternative maximum solutions.

In one embodiment of the present invention, finding a solution to the following maximization problem solves the trace assignment.

$$\text{Max} \sum_{i=1}^{i=M} \sum_{j=1}^{j=N} M_{ij}$$

Where $M_{ij}$ represents the number of traces assigned from the $i^{th}$ net group to the $j^{th}$ tree group; $M_{ij} \geq 0$ if the $i^{th}$ net group matches the $j^{th}$ tree group; $M_{ij} = 0$ if the $i^{th}$ net group does not match the $j^{th}$ tree group;

$$\sum_{j=1}^{j=N} M_{ij} \leq N_i;$$

$N_i$ represents the number of nets in the $i^{th}$ net group;

$$\sum_{i=1}^{i=M} \sum_{k=1}^{k=N} M_{ik} D_{k1} < T_1;$$

$D_{kl}=0$ if the $k^{th}$ tree node does not depend on $l^{th}$ trace group; $D_{kl}=1$ if the $k^{th}$ tree node depend on $l^{th}$ trace group; and, $T_l$ represents the number of nets in the $l^{th}$ trace group.

Alternatively, the trace cost can be minimized to assign the nets to traces. For example, $$\text{Min} C_T, \text{ where } C_T = \sum_{i=1}^{i=N} f_1(n_i, m_i), \text{ and } n_i = \left( N_i - \sum_{j=1}^{j=N} M_{ij} \right)$$

where $C_T$ is the total trace cost function.

Figure 23:
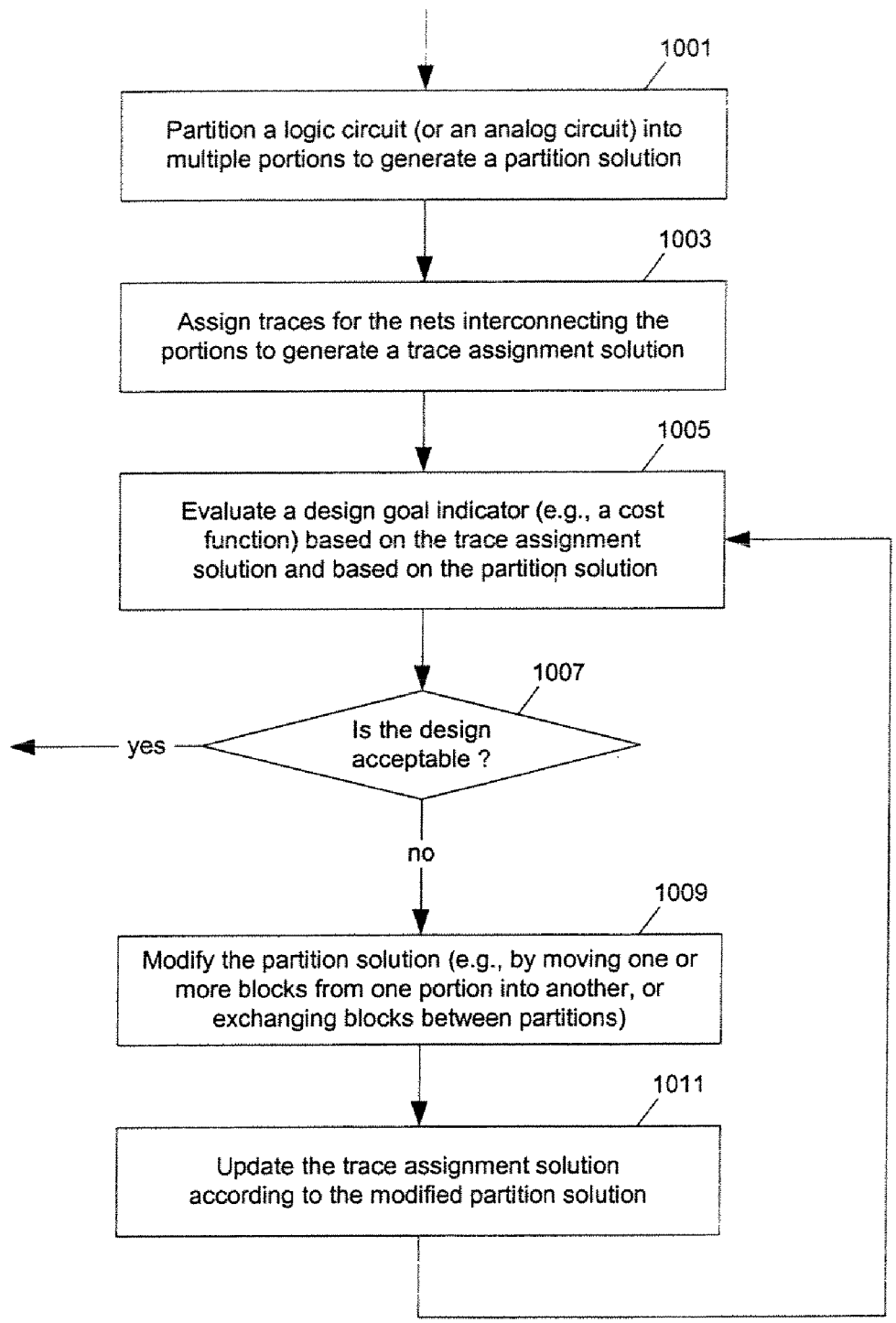
FIGS. 23-25 show methods to partition a circuit according to embodiments of the present invention.
Figure 24:
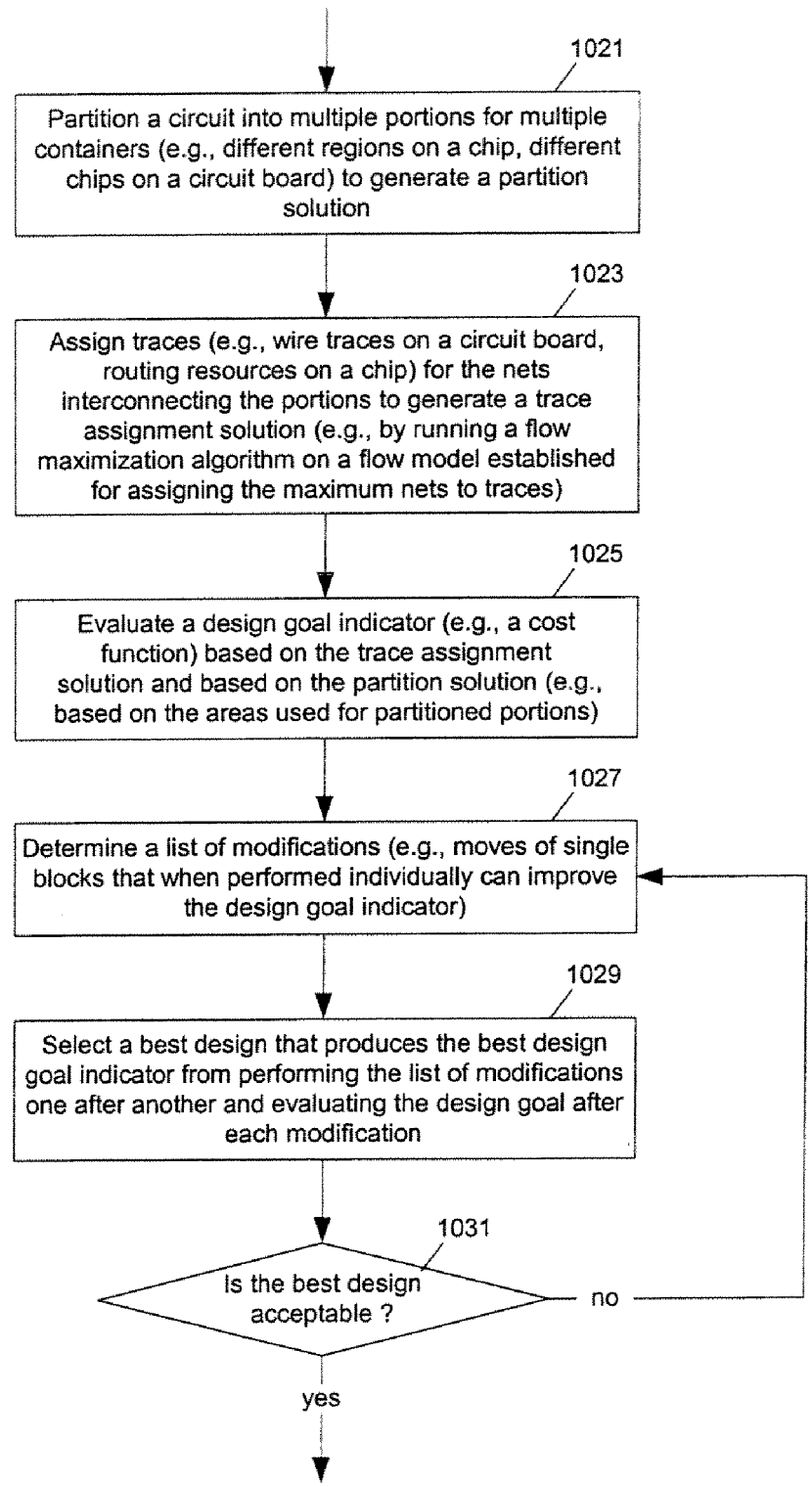
Figure 25:
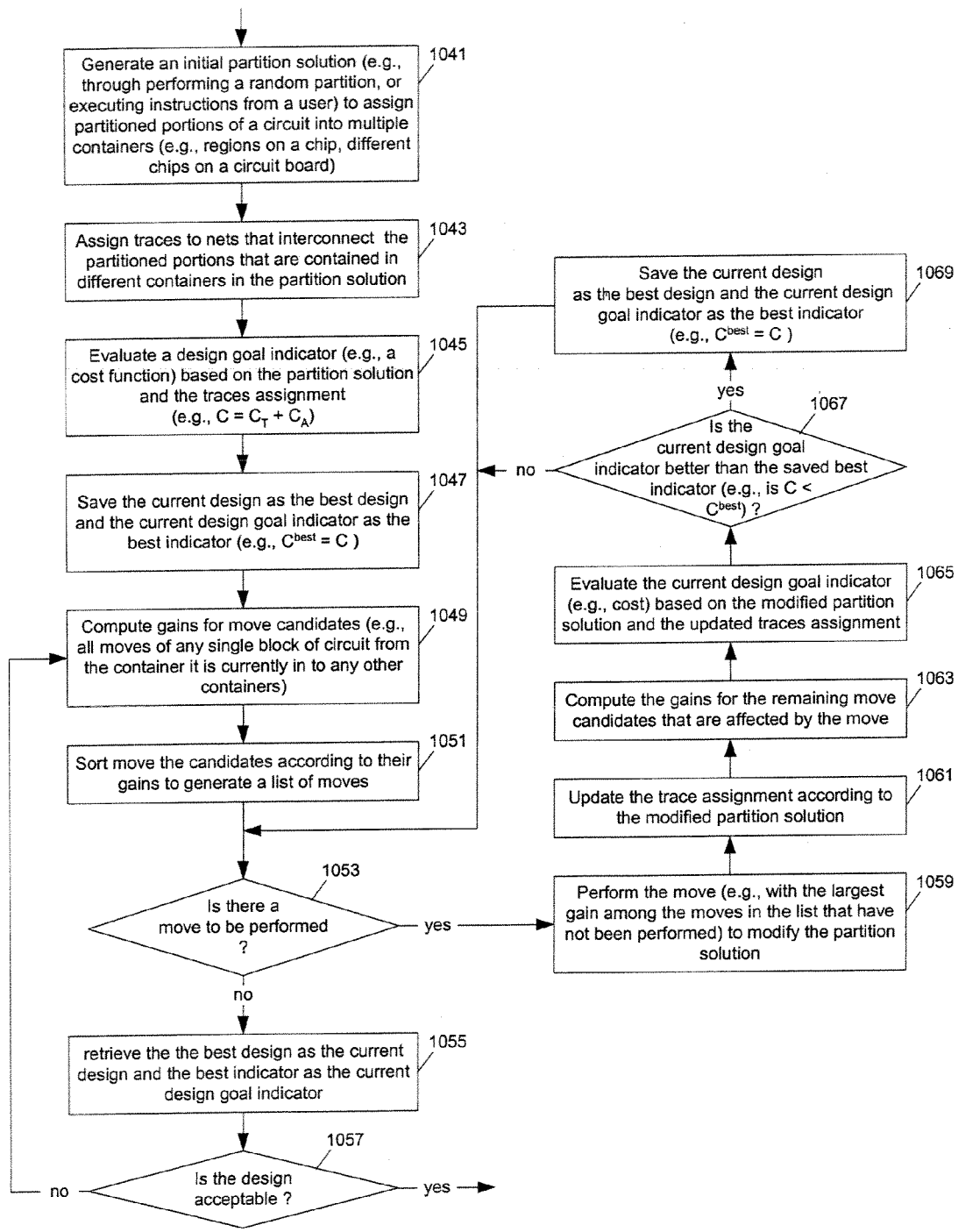

FIGS. 23-25 show methods to partition a circuit according to embodiments of the present invention. Operation 1001 partitions a logic circuit (or an analog circuit) into multiple portions to generate a partition solution. In the partition solution, different portions of the circuit are contained in different partitions. There are nets that interconnect the portions in different partitions. Operation 1003 assigns traces for the nets that interconnect the portions to generate a trace assignment solution. Operation 1005 evaluates a design goal indicator (e.g., a cost function) based on the trace assignment solution and based on the partition solution. If operation 1007 determines that the design is acceptable, according to the design goal indicator (e.g., when all the area constraints, trace constraints are met, or the design goal indicator can not be improved through an iteration process), the partition solution and the trace assignment solution is accepted; otherwise, operation 1009 modifies the partition solution (e.g., by moving one or more blocks from one portion into another, or exchanging blocks between partitions). Once the partition solution is modified, operation 1011 updates the trace assignment solution according to the modified partition solution; and, the design goal indicator is evaluated again in operation 1005.

The combined area-trace cost function can be used with any partitioning technique.

There are many techniques to modify a partition solution. One technique is to move one or more blocks at a time between the partition containers in order to reduce the cost function (or improve the design goal indicator). Various methods for moving blocks in conventional partitioning methods, such as those in the Fidducia Mattheyses algorithm, can also be used with various embodiments of the present invention.

FIG. 24 shows a more detailed flow chart of an example method. Operation 1021 partitions a circuit into multiple portions for multiple containers (e.g., different regions on a chip, different chips on a circuit board) to generate a partition solution. Operation 1023 assigns traces (e.g., wire traces on a circuit board, routing resources on a chip) for the nets interconnecting the portions to generate a trace assignment solution (e.g., by running a flow maximization algorithm on a flow model established for assigning the maximum nets to traces). The available traces for wiring among partitions can be predetermined or estimated. The trace assignment solution may include feedthrough solutions, as illustrated earlier in the description. Operation 1025 evaluates a design goal indicator (e.g., a cost function) based on the trace assignment solution (e.g., based on the number of unassigned traces) and based on the partition solution (e.g., based on areas used for partitioned portions). Operation 1027 determines a list of modifications (e.g., moves of single blocks that when performed individually can improve the design goal indicator); and, operation 1029 selects a best design that produces the best design goal indicator from performing the list of modifications one after another and evaluating the design goal after each modification. If operation 1031 determines that the best design is acceptable, the partitioning process ends; otherwise, operation 1027 is performed to further modify the partition solution in searching for one that correspond to a better design goal indicator.

FIG. 25 shows an example method to partition a circuit according to one embodiment of the present invention. A logic circuit to be partitioned can be represented as a register-transfer level (RTL) netlist. Operation 1041 generates an initial partition solution (e.g., through performing a random partition, or executing instructions from a user) to assign partitioned portions of a circuit into multiple containers (e.g., regions on a chip, different chips on a circuit board). Operation 1043 assigns traces to nets that interconnect the partitioned portions that are contained in different containers in the partition solution. Operation 1045 evaluates a design goal indicator (e.g., a cost function) based on the partition solution and the traces assignment (e.g., $C=C_T+C_A$). For example, a cost function described above can be used as a design goal indicator, which includes contributions from two parts. The first part of the cost function is the trace cost, which is the cost of assigning the nets that connect various logic blocks assigned to different containers, to physical traces between the containers. The second part is the area cost, which is the cost of the area of logic blocks assigned to each container. Operation 1047 saves the current design as the best design and the current design goal indicator as the best indicator (e.g., $C^{best}=C$).

After computing the cost of the partition, it is attempted to move a logic block from one partition to another to minimize the partition cost. The logic block 'm' to be moved is chosen on the basis of a quantity called 'gain' which is defined as the aggregate partition cost improvement when logic block 'm' is moved from one container to another. If the initial partition cost is $F(C_T, C_A)$, where $C_T$ is the trace cost, and $C_A$ is the area cost, and if the partition cost after the move is $F(C_T^n, C_A^n)$, where $C_T^n$ is the new trace cost and $C_A^n$ is the new area cost, the gain for moving block 'm' from the current partition to the specific partition can be computed from the difference between $F(C_T^n, C_A^n)$ and $F(C_T^n, C_A^n)$. Operation 1049 computes gains for move candidates (e.g., all moves of any single block of circuit from the container it is currently in to any other containers). For example, a move candidate represents a move of a block from its current partition to other partitions. A block can be moved from a current partition to any other partitions. Operation 1051 sorts the move candidates according to their gains to generate a list of moves. For example, the move candidates can be bucket sorted according to the gains. Operation 1053 determines whether or not there is a move to be performed. Performed moves will be locked in the iteration until a new list of move is generated in operation 1049. If moves in the list have been performed, operation 1055 retrieves the best design as the current design and the best indicator as the current design goal indicator. If operation 1057 determines the design acceptable (e.g., when all the area constraints, trace constraints are met, or the design goal indicator can not be improved through an iteration process), the partitioning process ends. Otherwise, operation 1049 is performed to generate a new list of move candidates.

If operation 1053 determines there is a move to be performed, operation 1059 performs the move (e.g., with the largest gain among the moves in the list that has not been performed) to modify the partition solution. Often the gain can have a non-positive value indicating an increase in the partition cost if the block is moved. The block is still moved with the expectation that the move allows the algorithm to "climb out of local minima". After the move, operation 1061 updates the trace assignment according to the modified partition solution; and, operation 1063 computes the gains for the remaining move candidates that are affected by the move. Depending on the cost function, moving a block from one container to another may affect the gain of any related moves. Related moves could be moves of blocks connected to the moved block, move of blocks in the source or destination partition of the move etc. Operation 1065 evaluates the current design goal indicator (e.g., cost) based on the modified partition solution and the updated traces assignment. If operation 1067 determines that the current design goal indicator is better than the saved best indicator (e.g., is $C<C_{best}$) operation 1069 saves the current design as the best design and the current design goal indicator as the best indicator (e.g., $C_{best}=C$); otherwise, operation 1053 checks again to determine if there is a move to be performed.

Figure 26:
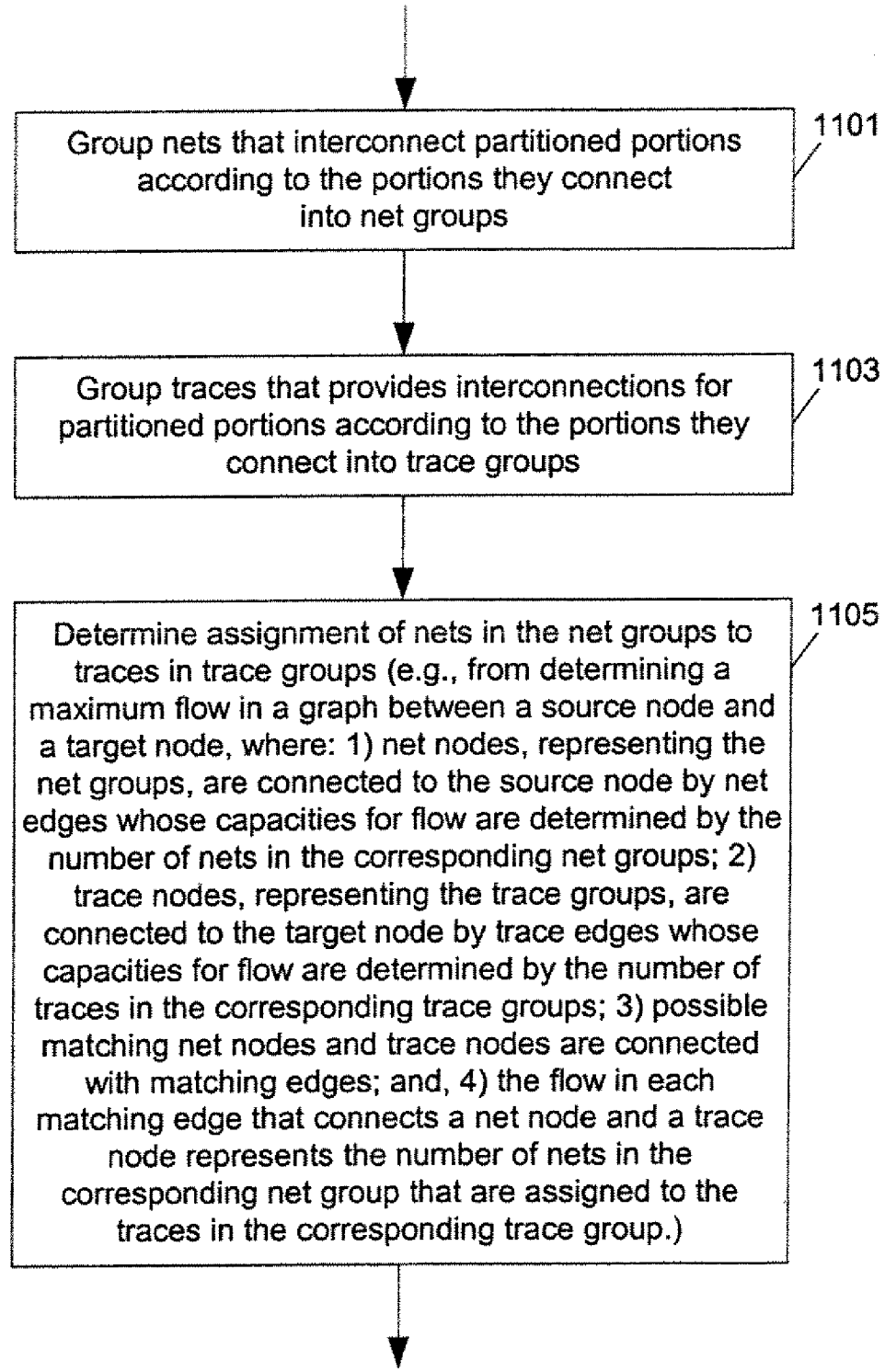
FIG. 26 shows a method to assign nets to traces according to embodiments of the present invention.

FIG. 26 shows a method to assign nets to traces according to embodiments of the present invention. Operation 1101 groups nets that interconnect partitioned portions according to the portions they connect into net groups; and, operation 1103 groups traces that provides interconnections for partitioned portions according to the portions they connect into trace groups. Operation 1105 determine assignment of nets in the net groups to traces in trace groups (e.g., from determining a maximum flow in a graph between a source node and a target node, where: 1) net nodes, representing the net groups, are connected to the source node by net edges whose capacities for flow are determined by the number of nets in the corresponding net groups; 2) trace nodes, representing the trace groups, are connected to the target node by trace edges whose capacities for flow are determined by the number of traces in the corresponding trace groups; 3) possible matching net nodes and trace nodes are connected with matching edges; and, 4) the flow in each matching edge that connects a net node and a trace node represents the number of nets in the corresponding net group that are assigned to the traces in the corresponding trace group.) Minimizing/Maximizing techniques, such as linear programming (for more details, see e.g., Dantzig, G. B. (1963): *Linear Programming and Extensions*, Princeton, N.J., Princeton University Press; Khachian, L. G. (1979): A polynomial algorithm in linear algorithm, *Doklady Adademiia Nauk* SSSR 244: 1093-1096, [English translation: Soviet Mathematics Doklady 20:191-194.]; Chvátal, Vašek: *Linear Programming*, W. H Freeman and Company, 1983) can also be used to determine a solution of the assignment of nets in the net groups to traces in trace groups. For example, the number of the assignment can be maximized; alternatively, the trace cost can be minimized.

Figure 27:
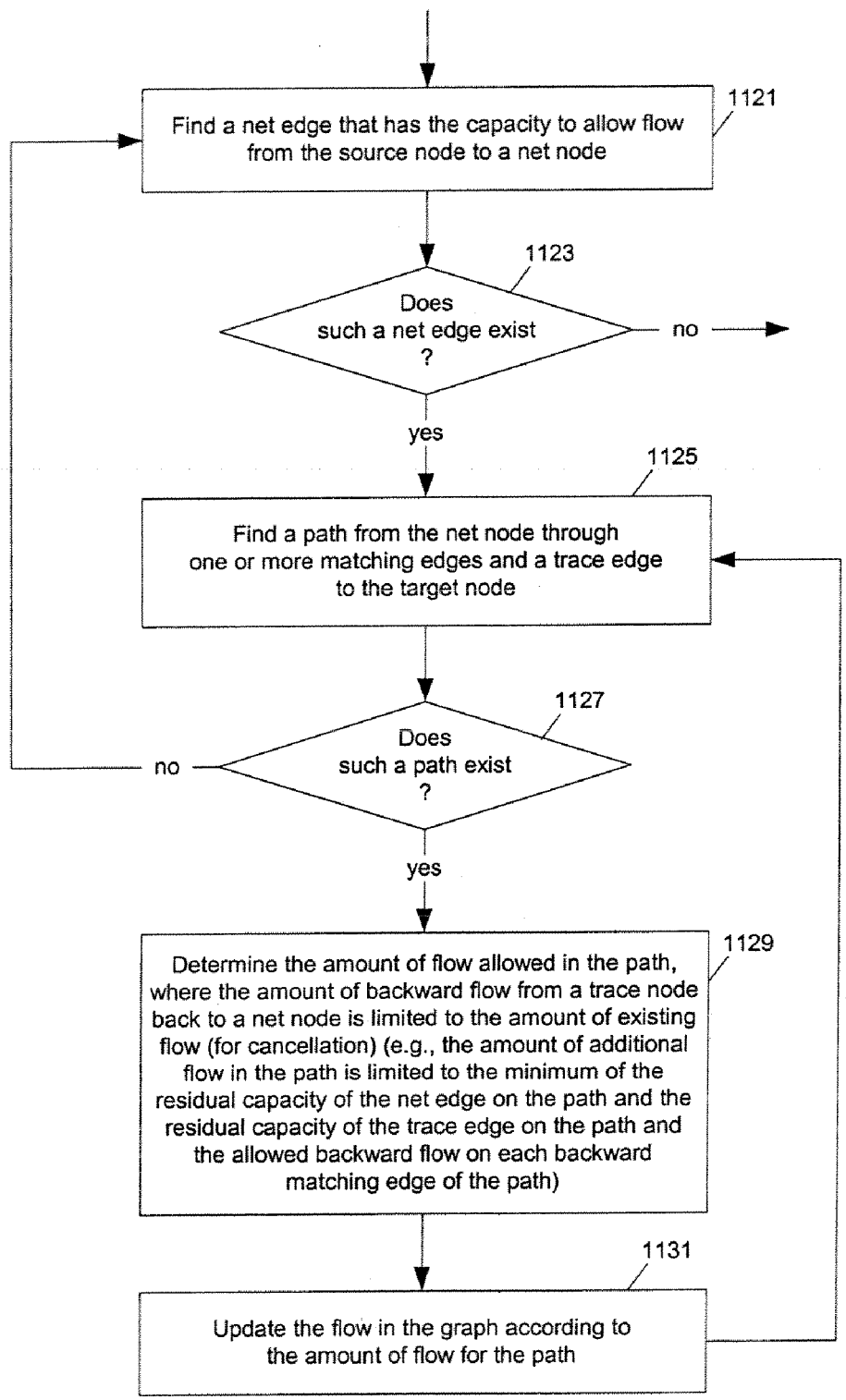
FIG. 27 shows a method to maximize flow in a flow diagram to assign nets to traces according to embodiments of the present invention.

FIG. 27 shows a method to maximize flow in a flow diagram to assign nets to traces according to embodiments of the present invention. Operation 1121 finds a net edge that has the capacity to allow flow from the source node to a net node. If operation 1123 determines that such a net edge does not exist, the process of maximizing the flow in the graph ends. Otherwise, operation 1125 finds a path from the net node through one or more matching edges and a trace edge to the target node. If operation 1127 determines that such a path does not exist, operation 1221 is performed to find another net edge that allows additional flow. If operation 1127 determines that such a path exists, operation 1129 determines the amount of flow allowed in the path, where the amount of backward flow from a trace node back to a net node is limited to the amount of existing flow (for cancellation) (e.g., the amount of additional flow in the path is limited to the minimum of the residual capacity of the net edge on the path and the residual capacity of the trace edge on the path and the allowed backward flow on each backward matching edge of the path). No backward flow in a trace edge or a net edge is allowed in finding a path to maximizing the flow. After operation 1131 updates the flow in the graph according to the amount of flow for the path, operation 1125 is performed find a path to push more flow from this net edge; alternative, operation 1121 can be performed to continue the flow maximizing process.

Figure 28:
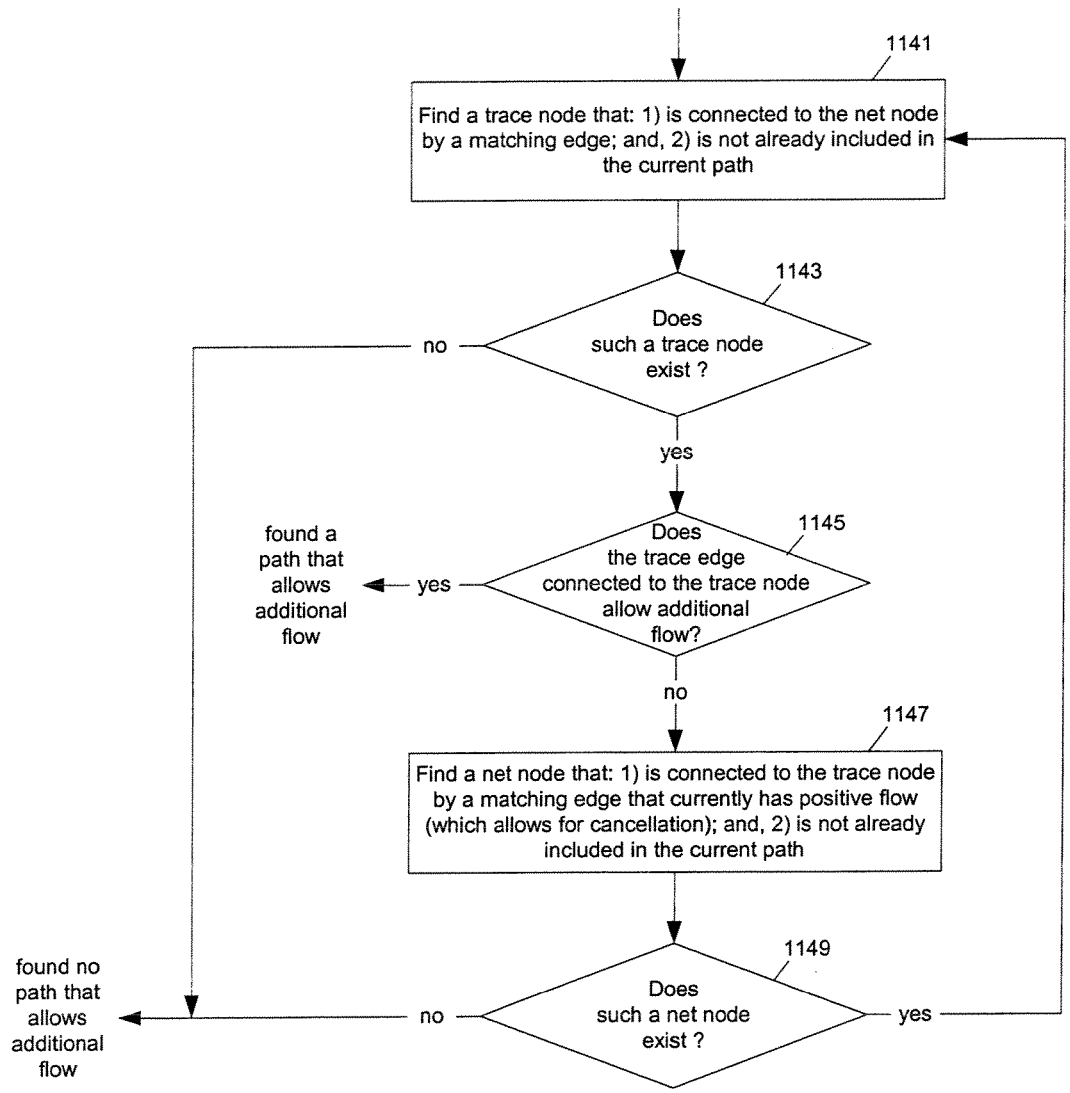
FIG. 28 shows a method to find a path for additional flow in a flow diagram to assign nets to traces according to embodiments of the present invention.

FIG. 28 shows a method to find a path for additional flow in a flow diagram to assign nets to traces according to embodiments of the present invention. Operation 1141 finds a trace node that: 1) is connected to the net node by a matching edge; and, 2) is not already included in the current path. If operation 1143 determines that such a trace node does not exist, no path that allows additional flow is found; otherwise, operation 1145 determines whether the trace edge connected to the trace node allows additional flow. If additional flow is allowed on the trace edge, a path that allows additional flow is found; otherwise, operation 1147 finds a net node that: 1) is connected to the trace node by a matching edge that currently has positive flow (which allows for cancellation); and, 2) is not already included in the current path. If operation 1149 determines that such a net node exists, operation 1141 is performed to continue the search; otherwise, no path that allows additional flow can be found.

From this description, it is understood that a similar method as shown in FIG. 28 can also be used in finding a path to reduce an amount of flow (e.g., when the capacity of a net edge is decreased after a partition scheme is modified).

Figure 29:
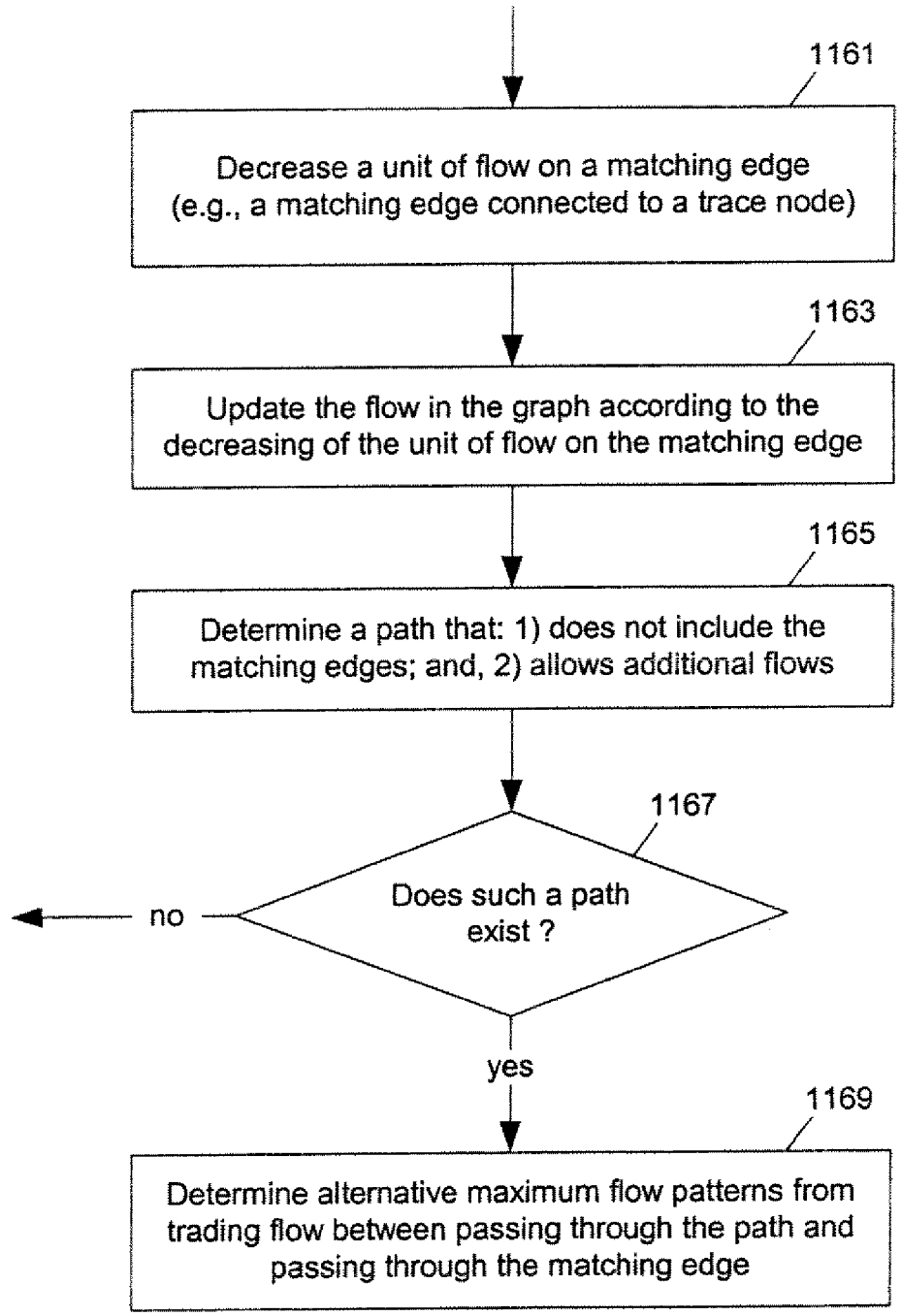
FIG. 29 shows a method to find alternative flow patterns in a flow diagram to assign nets to traces according to embodiments of the present invention.

FIG. 29 shows a method to find alternative flow patterns in a flow diagram to assign nets to traces according to embodiments of the present invention. Operation 1161 decrease a unit of flow on a matching edge (e.g., a matching edge connected to a trace node). Thus, the flow in net edge that is connected to the net node for the matching edge is decreased accordingly; and, the change is also propagated downstream toward the target node or is redirected to another net node. A method similar to the one in FIG. 28 can be used to find a path toward the target node for an additional "negative" flow. To sustain the negative flow in the forward direction (e.g., in the matching edge or in the trace edge), an amount of currently existing positive flow is required. A negative flow in the backward direction (e.g., in a matching edge), corresponding to adding positive flow in the matching edge, if admissible. A negative flow in the backward direction will redirect the flow from one matching edge to another matching edge. Operation 1163 updates the flow in the graph according to the decreasing of the unit of flow on the matching edge. Operation 1165 determines a path that: 1) does not include the matching edges; and, 2) allows additional flows. If operation 1167 determines that such a path does not exist, the unit of flow in the matching edge cannot be traded for other flow patterns. The previous solution may be recovered to determine if it is possible to trade the flow based on another matching edge. If such a path exists, operation 1169 determines alternative maximum flow patterns from trading flow between passing through the path and passing through the matching edge. In one embodiment of the present invention, the trace cost is evaluated to select the solution with reduced trace cost.

Moving a block from one container to another during partitioning changes the cost of the partition. The trace cost changes due to the change in connectivity of the logic blocks assigned to various containers; and, the area cost changes due to the change in area of the source and destination containers. In one embodiment of the present invention, the cost is updated incrementally to improve run-time efficiency.

Moving a block from one container to another changes the set of partitions connected to the net, for some nets that are connected to the moved block. Therefore, a net connected to a block may move to a different net group after the move of that block. To quickly compute the new set of partitions that a net connects to, a distribution of the net is maintained, which is defined as the number of blocks the net has in each container for a given partition. The distribution is computed for all the nets in the beginning. After a block is moved, the distribution of all the nets connected to the block changes. The net distribution is updated by decrementing the number of blocks in the source container by one and incrementing the number of blocks in the destination container by one. If the number of blocks in a partition change from "0" to non-zero (e.g., "1"), in the distribution of the net, the partition is added to the set of partitions that the net connects, and if the number of blocks changes from non-zero (e.g., "1") to "0", the partition is removed from the set of partitions that the net connects. Thus, by maintaining the distribution of the net, the net can be quickly moved from one net group to another when the connectivity of the net changes. The capacity of the net groups can be updated accordingly. The capacity of the net edges in the flow graph can be quickly updated from the capacity of the net groups after a move is performed. A move also affects the gain of other moves. To compute the trace gain of a move, the capacity of the net edges are updated, and then incremental flow is run to generate a net to trace assignment. The trace cost improvement is computed from the new trace assignment solution. In one embodiment of the invention, for each move, the change in capacity of each net group or net edge that the move will cause, is maintained as an array. After a move is performed, the net distribution of the nets connected to the moved block may change. The array of net group capacity changes needs to be updated for moves of blocks connected to the moved block. The array can be updated incrementally from the distribution of the net. From the array, the flow graph can be updated and incremental flow can be run to compute the new gain values. The array of net group capacity changes will not change for blocks that are not connected to the moved block. However, the flow graph changes after a move and therefore the trace gain needs to be recomputed for all the affected moves by updating the capacities of the net edges in the flow graph. Similarly, the area gains need to be recomputed for all the affected moves (For the given cost function, all the moves into or from the source or destination partition of the performed move need to be updated). The capacity of the trace edges typically remains fixed. After the net edge capacities are updated, the flow on some edges becomes invalid as some edges have a flow larger than the capacity. Excess flow on the edges is removed or redirected first and then the incremental flow is run to compute the matching cost.

For example, FIG. 35 shows an example of a net distribution for a partition solution illustrated in FIG. 3. Each column (e.g., 1401, 1407) represents the numbers of blocks that different nets have in a partition; and, rows (e.g., 1411 and 1413) represent the numbers of blocks that a net has in different partitions. For example, net mpr (1411, corresponding to net 331, 339 and 341 in FIG. 3) connects blocks m (311), p (315) and r (319), one block in each of partitions A, B and C. Thus, row 1411 shows {1, 1, 1, 0} for partitions A, B, C and D (column 1401, 1403, 1405, 1407) respectively. Similarly, net nr connects blocks n (313) and r (319), which are in partitions A and B (301 and 307) respectively. Thus, row 1413 shows the number of blocks for net nr as 1, 0, 1, 0 for partitions A, B, C and D respectively. A distribution of nets, as illustrated in FIG. 35 is computed for all nets when the first partition solution is obtained in one embodiment of the present invention. From the distribution of nets, the capacity of the net groups can be determined. For example, according to row 1411, one net connects partitions A, B and C. Thus, this net belongs to net group ABC. Similarly, net nr belongs to net group AC. Thus, the number of nets in each net group can be determined from the rows of the net distribution. When a block is moved from one partition to another, the net distribution changes. For example, when block n (313) in partition A (301) is moved to partition C (307), the distribution for net nr is changed. Since partition A is the source of the move and partition C is the destination of the move, the number of blocks for partition A in row 1413 is decreased by one; and, the number of blocks for partition C in row 1413 is increased by one. Thus, once block n (313) is moved from partition A to partition C, row 1413 is updated to {0, 0, 2, 0}. Since changes between "0" and "1" occurs in row 1413 (e.g, the number of blocks in partition A changes from "1" to "0" due to the move), net nr moves from one net group to another. In the example move, net nr moves from net group AC; thus, the capacity of net group is decreased by one. Since net nr connects only blocks in partition C after the move, it no longer needs a trace that interconnects partitions. Consider an alternative move in which block p (315) is moved from partition B (303) to partition C (307). Such a move causes the distribution for net mpr to change from {1, 1, 1, 0} to {1, 0, 2, 0} in row 1411 and net pq from {0, 2, 0, 0} to {0, 1, 1, 0} in row 1415. Changes from "1" to "0" occurs in both rows. The change in row 1411 moves net mpr from net group ABC to net group AC; and, the change in row 1411 moves net nr into group BC. Thus, the capacity of net group ABC is decreased by one; and the capacity of each of net groups AC and BC is increased by one. In this fashion, the distribution of nets allows the efficient updates of the capacities of net groups when the blocks are moved to modify the partition solution.

Figure 30:
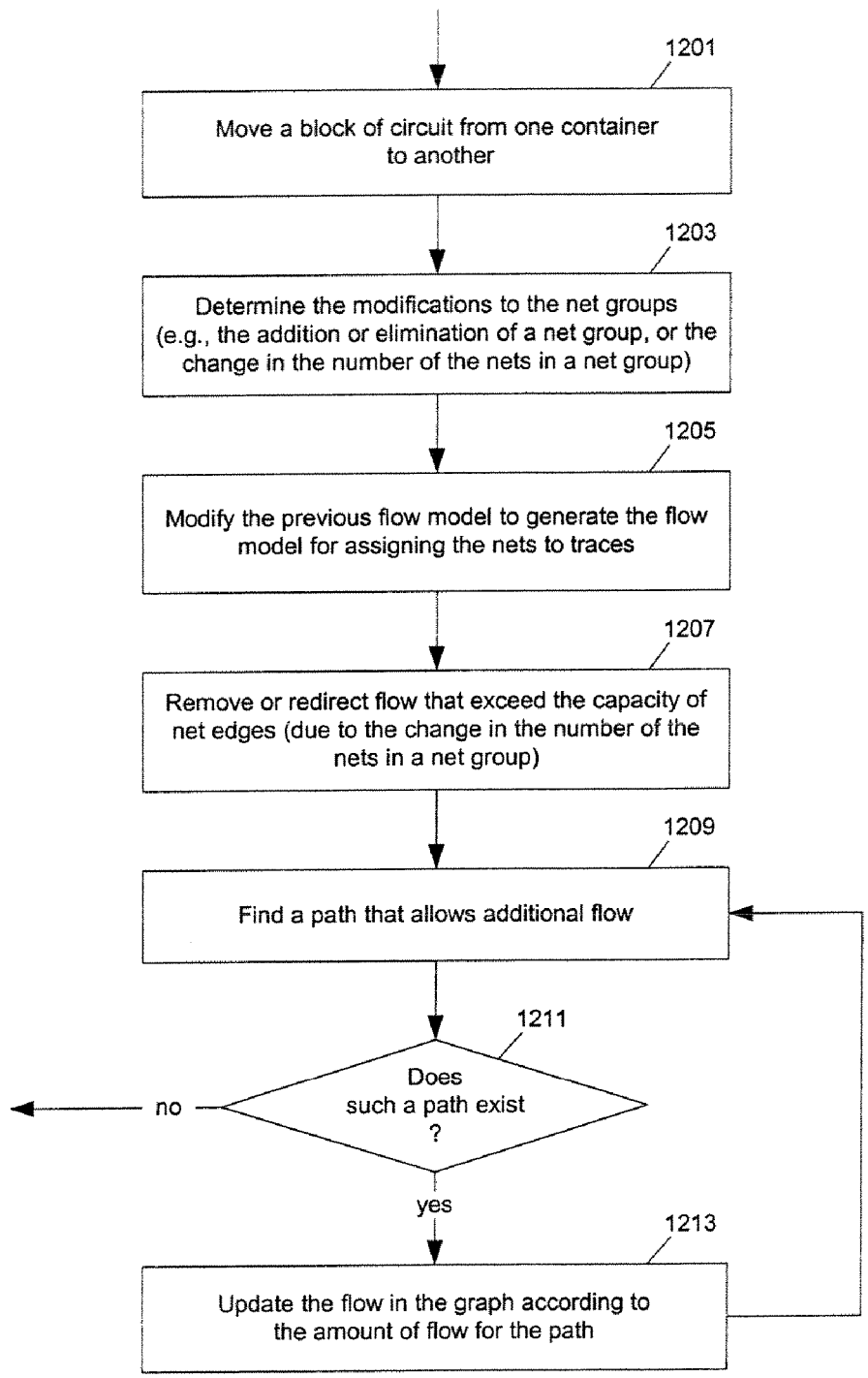
FIG. 30 shows a method to incrementally update the flow in a flow diagram to assign nets to traces based on previous solutions according to embodiments of the present invention.

FIG. 30 shows a method to incrementally update the flow in a flow diagram to assign nets to traces based on previous solutions according to embodiments of the present invention. After operation 1201 moves a block of circuit from one container to another, operation 1203 determines the modifications to the net groups (e.g., the addition or elimination of a net group, or the change in the number of the nets in a net group). Operation 1205 modifies the previous flow model to generate the flow model for assigning the nets to traces for the current partition solution. Operation 1207 cancels flow that exceeds the capacity of net edges (due to the change in the number of the nets in a net group), if any excessive flow exits. Operation 1209 finds a path that allows additional flow. If operation 1211 determines that such a path does not exist, a trace assignment solution is obtained. Alternatively, a method as shown in FIG. 29 can be used to continue searching for alternative solutions that further reduces the trace cost. If such a path exists, operation 1213 updates the flow in the graph according to the amount of flow for the path; and, operation 1209 is performed to find another augmenting path.

Figure 31:
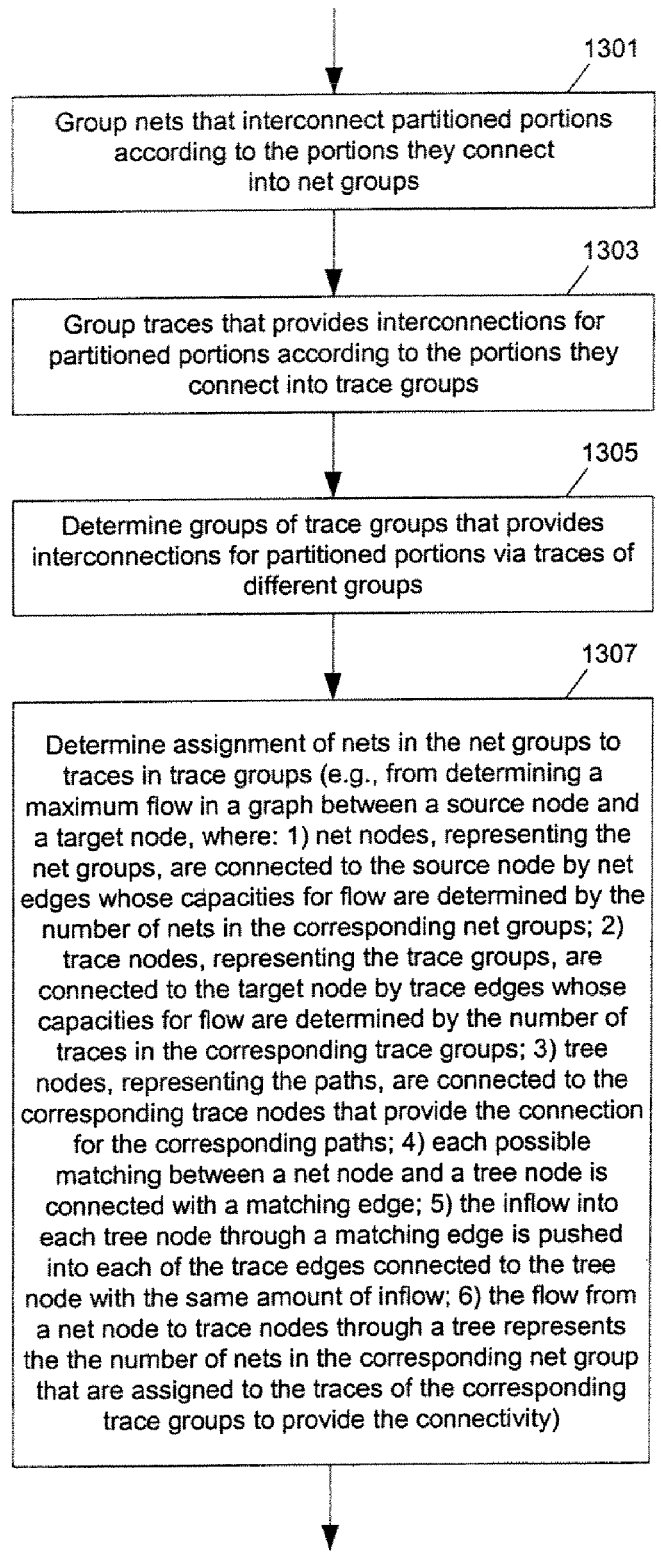
FIG. 31 shows a method to maximize flow in a flow diagram to assign nets to traces according to embodiments of the present invention, where multiple traces may be assigned to a net to provide the connectivity of the net.

FIG. 31 shows a method to maximize flow in a flow diagram to assign nets to traces according to embodiments of the present invention, where multiple traces may be assigned to a net to provide the connectivity of the net. Operation 1301 groups nets that interconnect partitioned portions according to the portions they connect into net groups. Operation 1303 groups traces that provides interconnections for partitioned portions according to the portions they connect into trace groups. Operation 1305 determines groups of trace groups that provide interconnections for partitioned portions via traces of different groups. Various feedthrough solutions can be found to combine traces from different trace groups to provide connectivity among different regions. Operation 1307 determine assignment of nets in the net groups to traces in trace groups (e.g., from determining a maximum flow in a graph between a source node and a target node, where: 1) net nodes, representing the net groups, are connected to the source node by net edges whose capacities for flow are determined by the number of nets in the corresponding net groups; 2) trace nodes, representing the trace groups, are connected to the target node by trace edges whose capacities for flow are determined by the number of traces in the corresponding trace groups; 3) tree nodes, representing the paths, are connected to the corresponding trace nodes that provide the connection for the corresponding paths; 4) each possible matching between a net node and a tree node is connected with a matching edge; 5) the inflow into each tree node through a matching edge is pushed into each of the trace edges connected to the tree node with the same amount of inflow; 6) the flow from a net node to trace nodes through a tree represents the number of nets in the corresponding net group that are assigned to the traces of the corresponding trace groups to provide the connectivity). Minimizing/Maximizing techniques, such as integer linear programming (for more details, see e.g., Dantzig, G. B. (1963): *Linear Programming and Extensions*, Princeton, N.J., Princeton University Press; Khachian, L. G. (1979): A polynomial algorithm in linear algorithm, *Doklady Adademiia Nauk* SSSR 244: 1093-1096, [English translation: Soviet Mathematics Doklady 20:191-194.]; Chvátal, Vašek: *Linear Programming*, W. H Freeman and Company, 1983) can also be used to determine a solution of the assignment of nets in the net groups to traces in trace groups. For example, the number of the assignment can be maximized; alternatively, the trace cost can be minimized.

Figure 32:
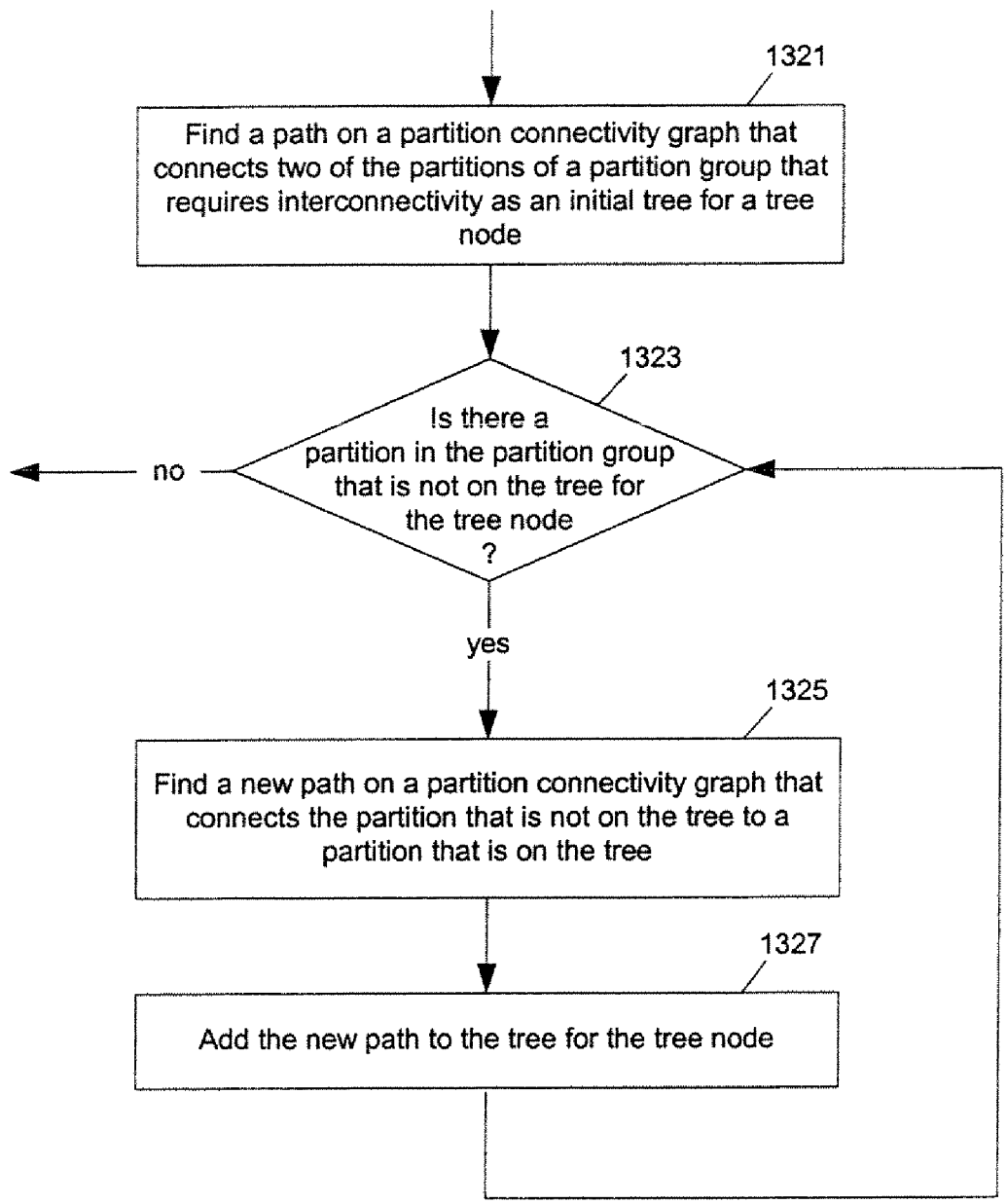
FIG. 32 shows a method to determine a combination of traces to provide the connectivity of a net according to one embodiment of the present invention.

FIG. 32 shows a method to determine a combination of traces to provide the connectivity of a net according to one embodiment of the present invention. Operation 1321 finds a path on a partition connectivity graph that connects two of the partitions of a partition group that requires interconnectivity as an initial tree for a tree node. If operation 1323 determines that all partitions in the partition group are on the tree for the tree node, a feedthrough solution is found; otherwise, operation 1325 finds a new path on a partition connectivity graph that connects the partition that is not on the tree to a partition that is on the tree; and, operation 1327 adds the new path to the tree for the tree node. The process repeats until all the partitions in the partition group are on the tree for the tree node. From this description, it is also understood that various graph algorithms for finding different trees each of which has the required subset of nodes of a graph can be used to find the possible feedthrough solutions.

Figure 33:
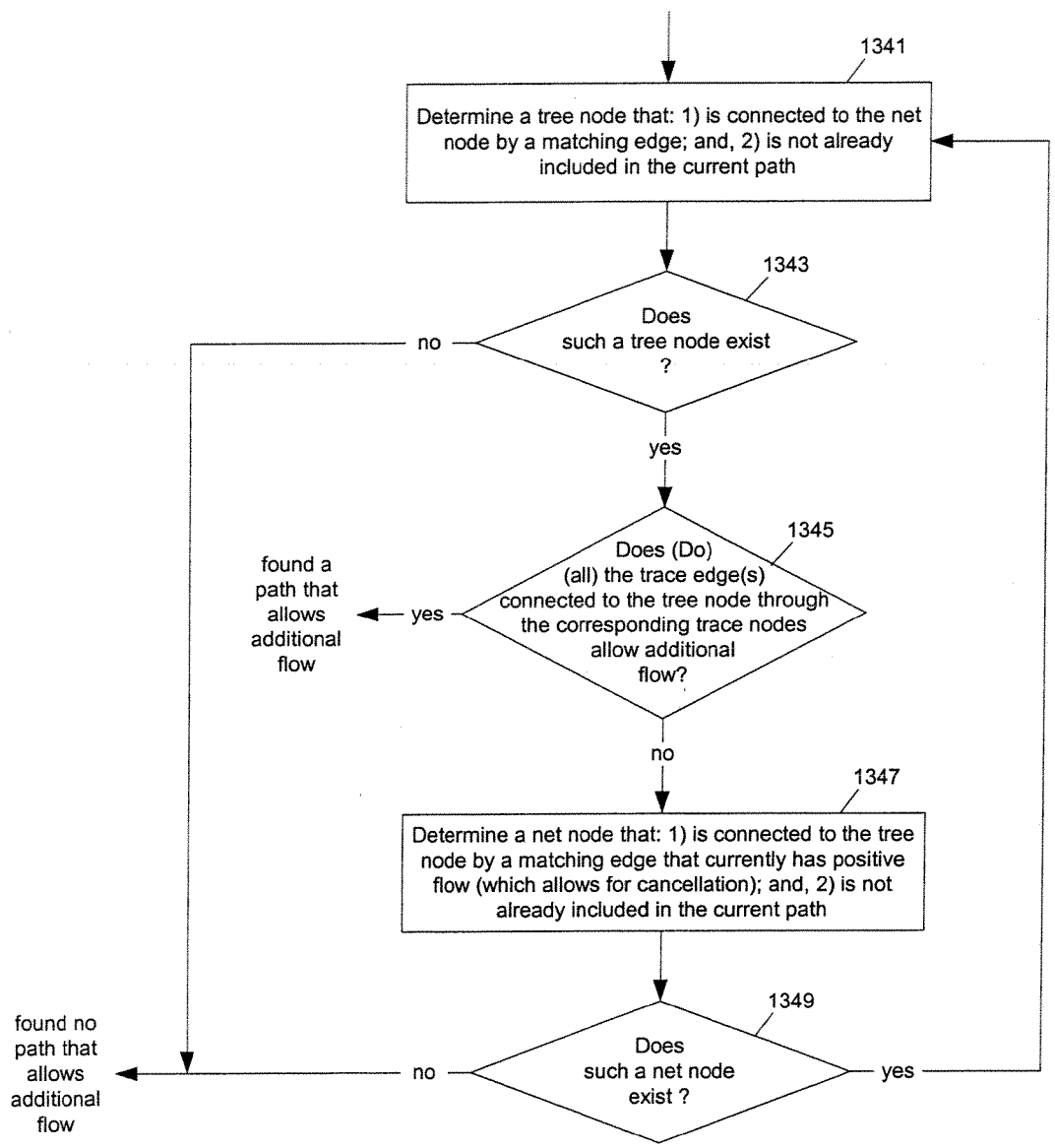
FIG. 33 shows a method to find a path for additional flow in a flow diagram to assign nets to traces according to embodiments of the present invention, where multiple traces may be assigned to a net to provide the connectivity of the net.

FIG. 33 shows a method to find a path for additional flow in a flow diagram to assign nets to traces according to embodiments of the present invention, where multiple traces may be assigned to a net to provide the connectivity of the net. Operation 1341 determines a tree node that: 1) is connected to the net node by a matching edge; and, 2) is not already included in the current path. If operation 1343 determines that such a tree node does not exist, no path that allows additional flow is found. Otherwise, operation 1345 determines whether all the trace edges connected to the tree node through the corresponding trace nodes of the tree node allow additional flow. If so, a path that allows additional flow is found. Note that the path typically includes multiple branches from the tree node to the target node, passing through the corresponding trace nodes of the tree node, as illustrated in FIG. 19. Otherwise, operation 1347 determines a net node that: 1) is connected to the tree node by a matching edge that currently has positive flow (which allows for cancellation); and, 2) is not already included in the current path. If operation 1349 determines that such a net node exists, operation 1341 is performed to continue the search; otherwise, no path that allows additional flow is found.

Figure 34:
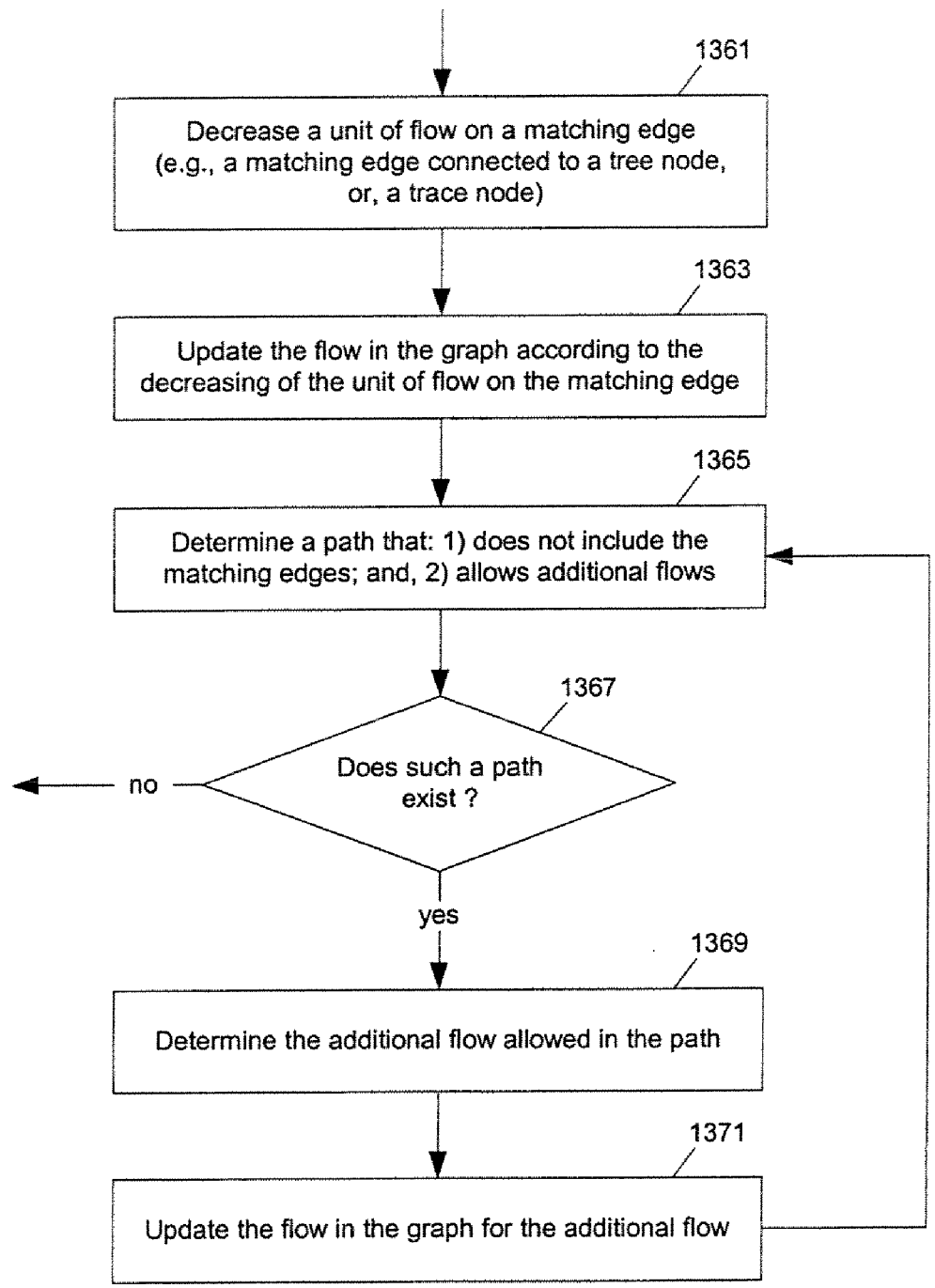
FIG. 34 shows a method to increase flow and/or find alternative maximum flow patterns in a flow diagram in order to assign nets to traces according to embodiments of the present invention, where multiple traces may be assigned to a net to provide the connectivity of the net.

FIG. 34 shows a method to increase flow and/or find alternative maximum flow patterns in a flow diagram in order to assign nets to traces according to embodiments of the present invention, where multiple traces may be assigned to a net to provide the connectivity of the net. Operation 1361 decreases a unit of flow on a matching edge (e.g., a matching edge connected to a tree node, or, a trace node). Operation 1363 updates the flow in the graph according to the decreasing of the unit of flow on the matching edge. Operation 1365 determines a path that: 1) does not include the matching edges; and, 2) allows additional flows. If operation 1367 determines that such a path does not exist, no alternative flow pattern is found; and, the previous solution may be recovered to find an alternative solution based on a different matching edge. Otherwise, Operation 1369 determines the additional flow allowed in the path; and, operation 1371 updates the flow in the graph for the additional flow. Then, operation 1365 is repeated to find an additional augmenting path.

Figure 36:
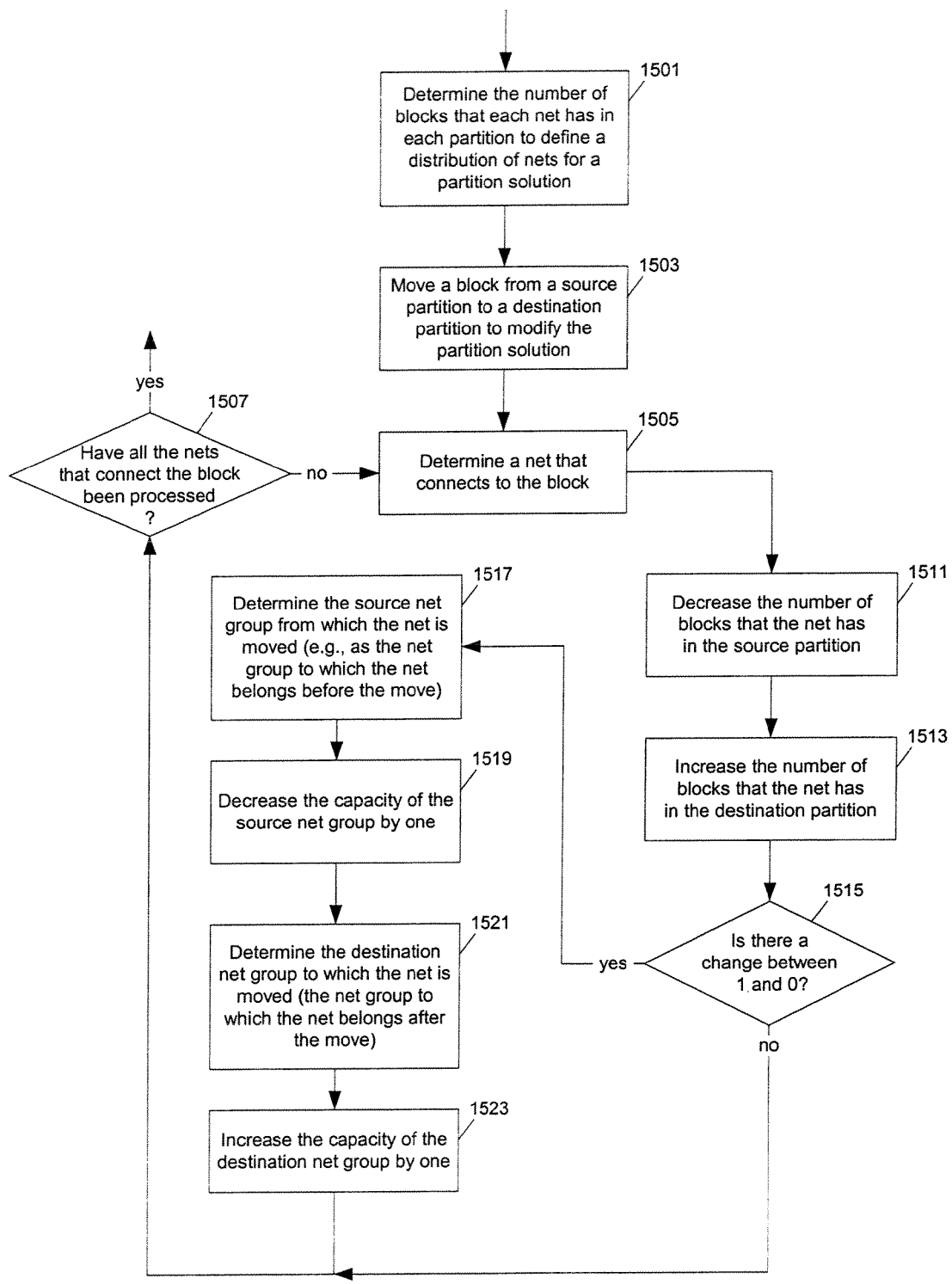
FIG. 36 shows a method to update the capacities of net groups according to one embodiment of the present invention.

FIG. 36 shows a method to update the capacities of net groups according to one embodiment of the present invention. Operation 1501 determines the number of blocks that each net has in each partition to define a distribution of nets for a partition solution. After operation 1503 moves a block from a source partition to a destination partition to modify the partition solution, operation 1505 determines a net that connects to the block. Operation 1511 decreases the number of blocks that the net has in the source partition; and, operation 1513 increases the number of blocks that the net has in the destination partition. If operation 1515 determines that there is at least one change between 1 and 0 in operations 1511 and 1513 (e.g., the number of blocks that the net has in the source partition changes from 1 to 0; or, the number of blocks that the net has in the destination partition changes from 0 to 1), the net moves from one net group (source net group) to another (destination net group). For example, if the number of blocks that the net has in the destination partition is increased from 0 to 1, the destination partition is added to the set of partition the net connects to. Similarly, if the number of blocks that the net has in the source partition is decreased from 1 to 0, the source partition is removed from the set of partition the net connects to. Thus, operation 1517 determines the source net group from which the net is moved (e.g., as the net group to which the net belongs before the move); and, operation 1519 decreases the capacity of the source net group by one. Similarly, operation 1521 determines the destination net group to which the net is moved (the net group to which the net belongs after the move); and, operation 1523 increases the capacity of the destination net group by one. If operation 1507 determines that not all the nets that connect the block have been processed, operation 1505 is performed. Once the capacities of the net groups are updated, the capacities of the net edges in the flow graph can be updated accordingly. Then, incremental flow algorithms can be used to obtain a new trace assignment solution based on the previous trace assignment solution.

While most embodiments of the present invention are intended for use in an HDL design synthesis software, the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention will be described in the context of use in HDL synthesis systems, and particularly those designed for use with integrated circuits which have vendor-specific technology/architectures. As is well known, the target architecture is typically determined by a supplier of programmable ICs. An example of a target architecture is the programmable lookup tables (LUTs) and associated logic of the integrated circuits which are field programmable gate arrays from Xilinx, Inc. of San Jose, Calif. Other examples of target architecture/technology include those well known architectures in field programmable gate arrays and complex programmable logic devices from vendors such as Altera, Lucent Technology, Advanced Micro Devices, and Lattice Semiconductor. For certain embodiments, the present invention may also be employed with application-specific integrated circuits (ASICs).

In one embodiment of the present invention, the cost function is a combined function of both the partition solution as well as the trace assignment solution. The combined cost function takes into consideration both the area of the circuits in a partition as well as the assignment of the nets to traces between the partitions, allowing a trade-off between area and traces. To improve the cost function (e.g., limit the usage of area and traces), blocks of circuits are moved among partitions and the trace assignment is updated accordingly. If the area limit of any partition is not met, the partitioning solution cannot be realized and is an infeasible solution. However, if there is an insufficient number of traces to assign the nets connecting different partitions, signals for multiple nets can be time multiplexed to share one or more traces to realize the connectivity.

In one embodiment of the present invention, to find a feasible partitioning solution, a multiplexing ratio is determined. Given an initial multiplexing ratio, the trace limits can be relaxed accordingly and partitioning can be performed with the relaxed trace constraint. The partitioner may arrive at a feasible solution with the relaxed trace constraints based on the initial multiplexing ratio. The multiplexing ratio can then be lowered to tighten the trace constraints and the partitioner can try to find a new partitioning solution. Partitioning can be performed several times by lowering the multiplexing ratio until no feasible partitioning solution can be found. The successful partition with the least multiplexing ratio can be used as the final partition solution.

A starting multiplexing ratio can be determined by first finding an initial partition that satisfies the area cost. Then, a net-to-trace assignment can be performed for the crossing nets and an estimate of the required multiplexing ratio to completely assign all the nets can be determined. The estimate can be used as a starting multiplexing ratio. Additional logic elements and control signals are needed in corresponding partitions to allow signals across the partition boundaries to share the traces that connect the partitions. The area of the overhead logic for implementing time multiplexing can be estimated and the overhead area can be considered in area constraint calculations. Further, multiplexing circuitry requires control and clock signals that cannot be multiplexed. Therefore, some traces are reserved for these control and clock signals. The area of the overhead logic and the number of overhead traces (e.g., for time multiplexing control and clock signals) can be determined based on the specific implementation of the multiplexing circuitry used. The overhead traces for control signals and clock signals are reserved and the number of remaining traces is multiplied by the multiplexing ratio to get the new trace constraint. The partitioner computes the partition cost based on the new constraints and tries to find a solution. If a feasible partition solution is found, the multiplexing ratio is reduced to tighten the trace constraints so that partitioning is performed with the new constraints.

Figure 37:
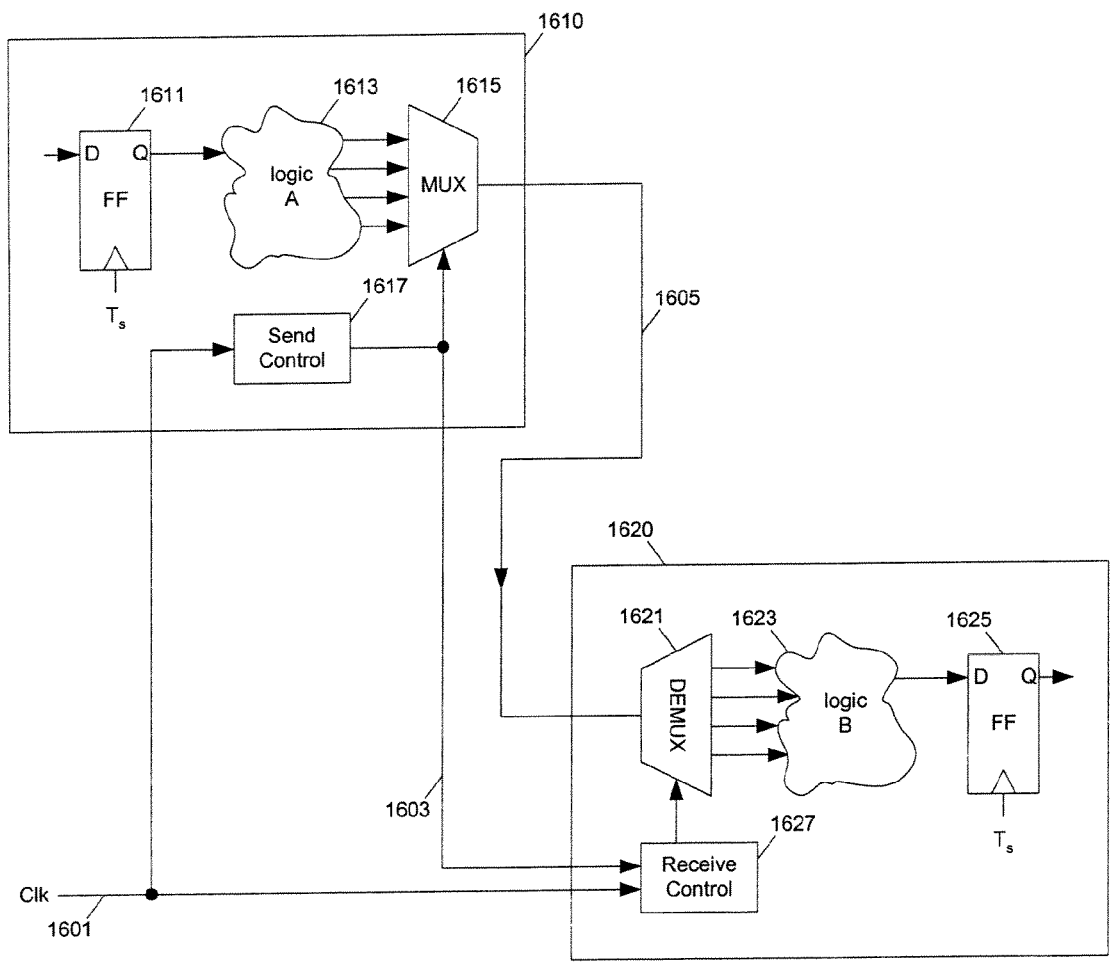
FIG. 37 shows one implementation of a logic circuit with time division multiplexing, which may be used with partitioning schemes according to embodiments of the present invention.

FIG. 37 shows one implementation of a logic circuit with time division multiplexing, which may be used with partitioning schemes according to embodiments of the present invention. In FIG. 37, partition 1610 has a plurality of signals that propagate from logic 1613 to logic 1623 in partition 1620. When there are not enough traces to assign each of the signals to one trace, the signals can be time multiplexed using multiplexer 1615 and demultiplexer 1621 so that the signals are transmitted from partition 1610 to partition 1620 through one or more shared traces (e.g., 1605). Any time multiplexing techniques known in the art can be used. In FIG. 37, overhead logic (e.g., send control 1617, multiplexer 1615, receiver control 1627, de-multiplexer 1621) is added to implement the time multiplexing, which consumes additional area in the corresponding partitions. Further, clock signals (e.g., 1601) and control signals (e.g., 1603) cannot be time multiplexed. Thus, a number of traces between partition 1610 and 1620 are reserved for these nets that cannot be time multiplexed. The number of remaining traces can be multiplied by the multiplexing ratio to determine the trace resources that can be used for the signals from logic 1613 to logic 1623.

Figure 38:
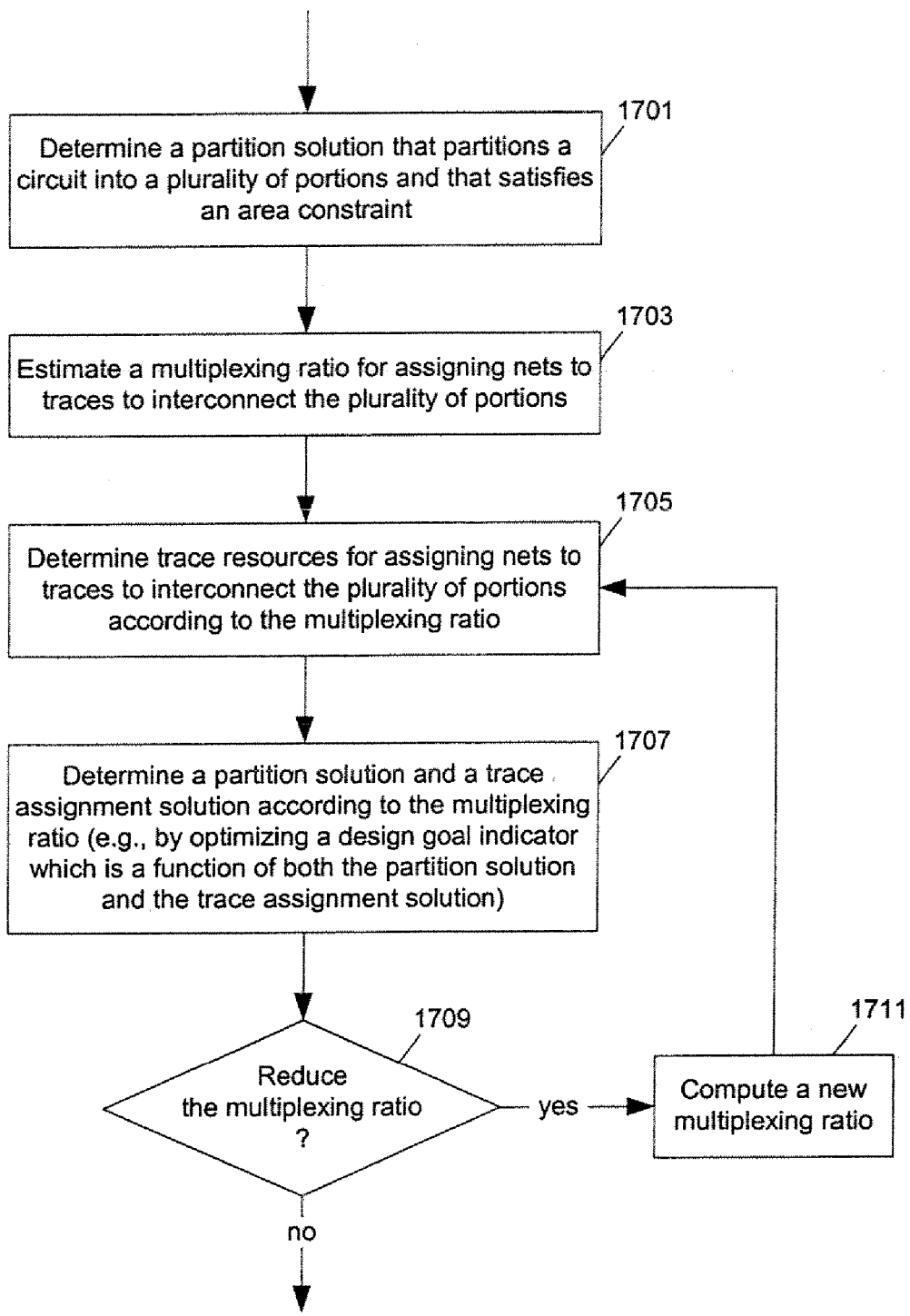
FIG. 38 shows a method of partitioning using an automatic multiplexing ratio according one embodiment of the present invention.

FIG. 38 shows a method of partitioning using an automatic multiplexing ratio according one embodiment of the present invention. In FIG. 38, operation 1701 determines a partition solution that partitions a circuit into a plurality of portions and that satisfies an area constraint. Operation 1703 estimates a multiplexing ratio for assigning nets to traces to interconnect the plurality of portions. The multiplexing ratio can be estimated by determining the least multiplexing ratio that allows all signals being routed within the trace constraint for the partition solution. Operation 1705 determines trace resources for assigning nets to traces to interconnect the plurality of portions according to the multiplexing ratio. Operation 1707 determines a partition solution and a trace assignment solution according to the multiplexing ratio (e.g., by optimizing a design goal indicator which is a function of both the partition solution and the trace assignment solution). For example, a cost function that combines the consideration of trace usage and area usage, as described above, can be used to evaluate the modifications to the partition solution through moving blocks among the partitions. After optimizing the cost function through moving blocks among the partitions, a new partition solution and a new trace assignment solution can be obtained with the multiplexing ratio. If operation 1709 determines to reduce the multiplexing ratio, operation 1711 computes a new, reduced multiplexing ratio (e.g., by reducing the multiplexing ratio by one) so that the trace resources are tightened. Operations 1705 and 1707 can then be further performed to obtain a partition solution and a trace assignment solution. Note that when the multiplexing ratio is reduced so that the partitioner cannot find a solution that satisfies both the area constraint and the trace constraint, a larger multiplexing ratio that allows the partitioner to find a solution that satisfies both the area constraint and the trace constraint is used. Further, the multiplexer ratio may be reduced to one, in which case no multiplexing is necessary to satisfy the trace constraint.

Figure 39:
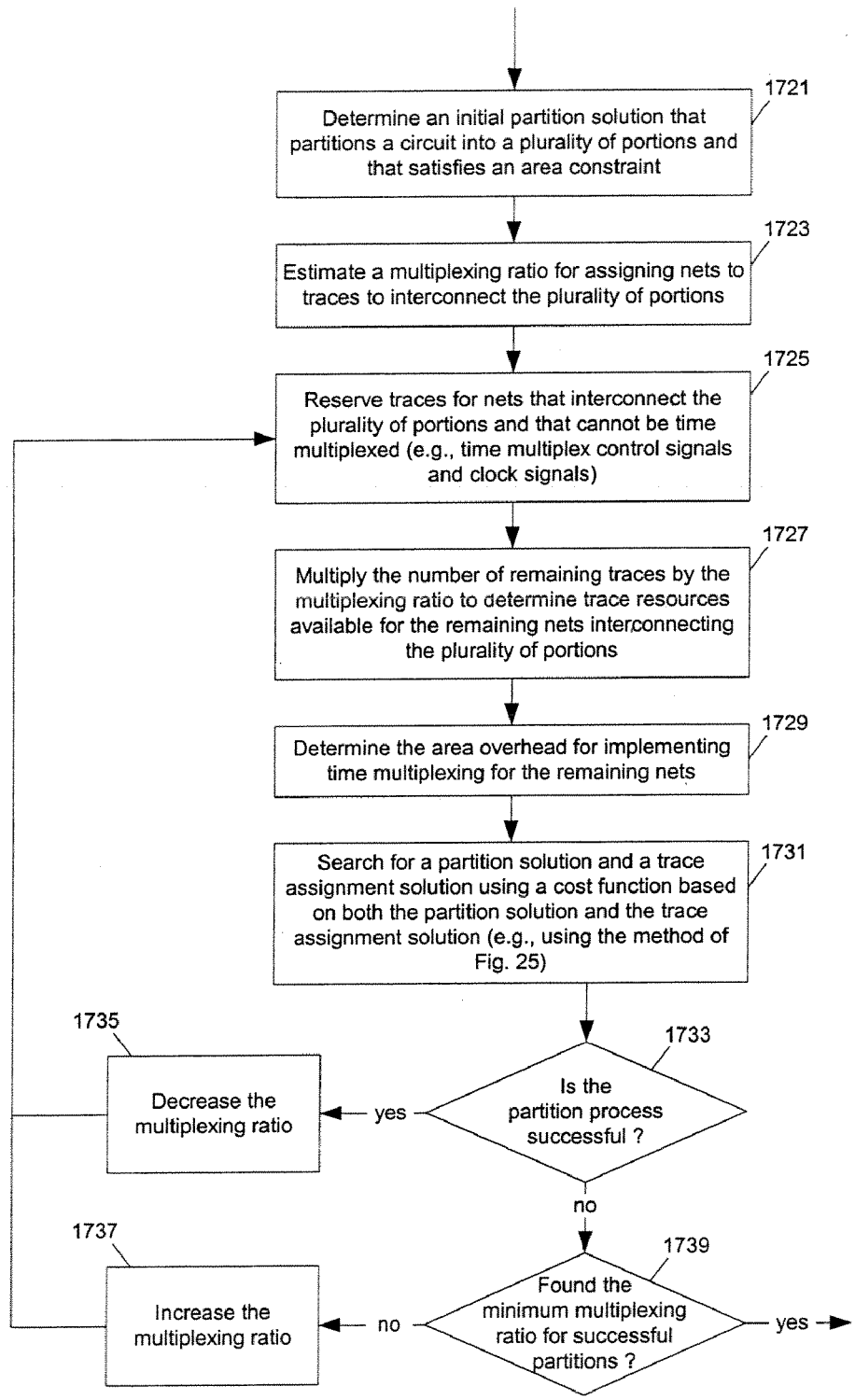
FIG. 39 shows a detailed method of partitioning using a multiplexing ratio according one embodiment of the present invention.

FIG. 39 shows a detailed method of partitioning using a multiplexing ratio according one embodiment of the present invention. In FIG. 39, operation 1721 determines an initial partition solution that partitions a circuit into a plurality of portions and that satisfies an area constraint. If the area constraint cannot be satisfied, it may be concluded that it is not feasible to find a partition solution for the given resources. Operation 1723 estimates a multiplexing ratio for assigning nets to traces to interconnect the plurality of portions. Operation 1725 reserves traces for nets that interconnect the plurality of portions and that cannot be time multiplexed (e.g., time multiplex control signals and clock signals). Operation 1727 multiplies the number of remaining traces by the multiplexing ratio to determine trace resources available for the remaining nets interconnecting the plurality of portions. For example, for the purpose of enforcing the trace constraint, the times slots available for routing signals of different nets are translated into the equivalent number of traces available for the nets crossing the partition boundaries. Operation 1729 determines the area overhead for implementing time multiplexing for the remaining nets. Operation 1731 searches for a partition solution and a trace assignment solution using a cost function based on both the partition solution and the trace assignment solution. For example, the method of FIG. 25 can be used. For example, a cost function that is based on both the partition solution and the trace assignment solution can be used to determine the move of a block from one partition to another to reduce the cost function. The cost function may be reduced incrementally through such block moves to satisfy the design constraint. If operation 1733 determines that the partition process is successful (the design constraint for area and trace is satisfied), the current multiplexing ratio is permissible. Then, operation 1735 decreases the multiplexing ratio to search for a smaller multiplexing ratio that can lead to a successful partition of the circuit. For example, the multiplexing ratio can be decreased by one. Alternatively, the multiplexing ratio can be decreased to a number that is between the current multiplexing ratio and one (e.g., a number halfway between the current multiplexing ratio and one, such as in a binary search scheme). If operation 1733 determines that the partition process is not successful because of lack of trace resources, operation 1739 determines if the minimum multiplexing ratio for successful partitions is already found. For example, when the multiplexing ratio that is equal to one plus the current multiplexing ratio has previously led to a successful partition solution, the minimum permissible multiplexing ratio is found to be one plus the current multiplexing ratio. Thus, the partition solution corresponding to the minimum permissible multiplexing ratio is used. Otherwise, operation 1737 increases the multiplexing ratio. For example, the multiplexing ratio can be increased by one, or increased to a number between the current multiplexing ratio and the smallest multiplexing ratio that has previously led to a successful partition, or to a larger estimated multiplexing ratio if no permissible multiplexing ratio has been previously found. Note that the smallest possible multiplexing ratio is one. There is no need for multiplexing if a successful partition is found with a multiplexing ratio of one. It may be desirable to specify a maximum possible multiplexing ratio. If no success partition solution can be found using the maximum possible multiplexing ratio, it may be considered that it is infeasible to found a partition solution for the given resources.

In one embodiment of the present invention, the partition solution is modified through selectively moving blocks among partitions to reduce the cost function which is a function of both the partition solution and the trace assignment solution. During the process of minimizing the cost function, the multiplexing ratio is reduced when not all available trace resources across a partition boundary are used in the trace assignment solution. In one embodiment, a single multiplexing ratio is used to compute the equivalent number of traces available for the nets crossing all partition boundaries. Alternatively, different multiplexing ratios are used to compute the equivalent number of traces available for the nets crossing different partition boundaries. For example, time multiplexing at individual partition boundaries can be individually controlled by different multiplexing ratios. Further, in one embodiment of the present invention, the cost function further includes the consideration of multiplexing ratios (e.g., a function of one or more multiplexing ratios). For example, a higher multiplexing ratio contributes to a higher value of the cost function.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to design a circuit, the method comprising:
    determining by a computer a first multiplexing ratio; and
    determining, according to the first multiplexing ratio, a first partition solution of the circuit and a first trace assignment solution for nets crossing partition boundaries of the first partition solution of the circuit, the first trace assignment solution time multiplexing signals for a first plurality of nets crossing partition boundaries of the first partition solution according to the first multiplexing ratio, the first trace assignment solution satisfying a trace constraint, the first partition solution satisfying an area constraint when circuitry for time multiplexing signals for the first plurality of nets is considered.

2. The method of claim 1, further comprising:
    adjusting the first multiplexing ratio to determine a second multiplexing ratio; and
    determining, according to the second multiplexing ratio, a second partition solution of the circuit and a second trace assignment solution for nets crossing partition boundaries of the second partition solution of the circuit, the second trace assignment solution time multiplexing signals for a second plurality of nets crossing partition boundaries of the second partition solution according to the second multiplexing ratio, the second trace assignment solution satisfying a trace constraint, the second partition solution satisfying an area constraint when circuitry for time multiplexing signals for the second plurality of nets is considered.

3. The method of claim 1, wherein said determining the first partition solution of the circuit and the first trace assignment solution comprises:
    selectively moving a block of the circuit from a first partition to a second partition to improve a design goal which is a function of both a partition solution and a trace assignment solution.

4. The method of claim 3, further comprising:
    determining, according to the first multiplexing ratio, trace resources available for nets crossing partition boundaries;
    wherein the trace constraint is based on the trace resource determined according to the first multiplexing ratio.

5. The method of claim 4, wherein said determining the trace resources comprises:
    reserving a number of traces between a first partition and a second partition for a number of signals that cannot be time multiplexed; and
    multiplying remaining number of traces between the first partition and the second partition, which are not reserved, by the first multiplexing ratio to determine the trace resources.

6. The method as in claim 1, wherein the first partition solution is generated from searching for maximum flow in a first flow diagram.

7. A method as in claim 6, wherein a second partition solution is determined from searching for maximum flow in a second flow diagram which is constructed based on the first flow diagram.

8. A method as in claim 7, wherein the first and second partitioning solutions are generated from searching, using integer linear programming, for an extreme value.

9. The method as in claim 1, further comprising:
    searching for a second partition solution using a cost function based on the first partition solution and the first trace assignment solution.

10. The method as in claim 9, wherein the cost function increases as a number of nets that cannot be assigned to traces in the trace assignment solution increases; and, the cost function increases as an area of circuits in a partition in the partitioning solution that exceeds a threshold increases.

11. A non-transitory machine readable medium containing executable computer program instructions which when executed by a digital processing system cause said system to perform a method to design a circuit, the method comprising:

determining a first multiplexing ratio; and determining, according to the first multiplexing ratio, a first partition solution of the circuit and a first trace assignment solution for nets crossing partition boundaries of the first partition solution of the circuit, the first trace assignment solution time multiplexing signals for a first plurality of nets crossing partition boundaries of the first partition solution according to the first multiplexing ratio, the first trace assignment solution satisfying a trace constraint, the first partition solution satisfying an area constraint when circuitry for time multiplexing signals for the first plurality of nets is considered.

12. The medium of claim 11, wherein the method further comprises:

adjusting the first multiplexing ratio to determine a second multiplexing ratio; and determining, according to the second multiplexing ratio, a second partition solution of the circuit and a second trace assignment solution for nets crossing partition boundaries of the second partition solution of the circuit, the second trace assignment solution time multiplexing signals for a second plurality of nets crossing partition boundaries of the second partition solution according to the second multiplexing ratio, the second trace assignment solution satisfying a trace constraint, the second partition solution satisfying an area constraint when circuitry for time multiplexing signals for the second plurality of nets is considered.

13. The medium of claim 11, wherein said determining the first partition solution of the circuit and the first trace assignment solution comprises:

selectively moving a block of the circuit from a first partition to a second partition to improve a design goal which is a function of both a partition solution and a trace assignment solution.

14. The medium of claim 13, wherein the method further comprises:

determining, according to the first multiplexing ratio, trace resources available for nets crossing partition boundaries;

wherein the trace constraint is based on the trace resource determined according to the first multiplexing ratio.

15. The medium of claim 14, wherein said determining the trace resources comprises:

reserving a number of traces between a first partition and a second partition for a number of signals that cannot be time multiplexed; and multiplying remaining number of traces between the first partition and the second partition, which are not reserved, by the first multiplexing ratio to determined the trace resources.

16. A data processing system to design a circuit, the system comprising:

memory storing a netlist representation of the circuit; and a processor coupled to the memory to:

determine a first multiplexing ratio; and determine, according to the first multiplexing ratio, a first partition solution of the circuit and a first trace assignment solution for nets crossing partition boundaries of the first partition solution of the circuit, the first trace assignment solution time multiplexing signals for a first plurality of nets crossing partition boundaries of the first partition solution according to the first multiplexing ratio, the first trace assignment solution satisfying a trace constraint, the first partition solution satisfying an area constraint when circuitry for time multiplexing signals for the first plurality of nets is considered.

17. The system of claim 16, wherein the processor is coupled to the memory to further:

adjust the first multiplexing ratio to determine a second multiplexing ratio; and determine, according to the second multiplexing ratio, a second partition solution of the circuit and a second trace assignment solution for nets crossing partition boundaries of the second partition solution of the circuit, the second trace assignment solution time multiplexing signals for a second plurality of nets crossing partition boundaries of the second partition solution according to the second multiplexing ratio, the second trace assignment solution satisfying a trace constraint, the second partition solution satisfying an area constraint when circuitry for time multiplexing signals for the second plurality of nets is considered.

18. The system of claim 16, wherein the processor determines the first partition solution of the circuit and the first trace assignment solution through:

selectively moving a block of the circuit from a first partition to a second partition to improve a design goal which is a function of both a partition solution and a trace assignment solution.

19. The system of claim 18, wherein the processor is coupled to the memory to further:

determine, according to the first multiplexing ratio, trace resources available for nets crossing partition boundaries;

wherein the trace constraint is based on the trace resource determined according to the first multiplexing ratio.

20. The system of claim 19, wherein the processor determines the trace resources through:

reserving a number of traces between a first partition and a second partition for a number of signals that cannot be time multiplexed; and multiplying remaining number of traces between the first partition and the second partition, which are not reserved, by the first multiplexing ratio to determined the trace resources.

* * * * *